(12) United States Patent
Tsai et al.

(10) Patent No.: US 11,594,508 B2
(45) Date of Patent: Feb. 28, 2023

(54) REDISTRIBUTION LINES HAVING NANO COLUMNS AND METHOD FORMING SAME

(71) Applicant: Taiwan Semiconductor Manufacturing Co., Ltd., Hsinchu (TW)

(72) Inventors: Po-Hao Tsai, Zhongli (TW); Ming-Da Cheng, Taoyuan (TW); Wen-Hsiung Lu, Tainan (TW); Hsu-Lun Liu, Tainan (TW); Kai-Di Wu, Tainan (TW); Su-Fei Lin, Tainan (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 226 days.

(21) Appl. No.: 17/069,539

(22) Filed: Oct. 13, 2020

(65) Prior Publication Data

US 2021/0375815 A1    Dec. 2, 2021

Related U.S. Application Data

(60) Provisional application No. 63/030,619, filed on May 27, 2020.

(51) Int. Cl.
    *H01L 23/00*         (2006.01)

(52) U.S. Cl.
    CPC ............. *H01L 24/20* (2013.01); *H01L 24/19* (2013.01); *H01L 2224/2101* (2013.01); *H01L 2224/211* (2013.01); *H01L 2224/215* (2013.01)

(58) Field of Classification Search
    CPC ...................................... H01L 2224/2101–215
See application file for complete search history.

(56) References Cited

U.S. PATENT DOCUMENTS

| | | | |
|---|---|---|---|
| 10,049,997 B2 | 8/2018 | Choi et al. | |
| 2007/0284723 A1* | 12/2007 | Kim ................... | H01L 23/3114 257/692 |
| 2012/0009777 A1* | 1/2012 | Liu ......................... | H01L 24/05 257/E21.59 |
| 2015/0380334 A1* | 12/2015 | Hu ....................... | H01L 21/6835 257/773 |
| 2020/0083189 A1 | 3/2020 | Chen et al. | |

FOREIGN PATENT DOCUMENTS

TW             201810579 A     3/2018

\* cited by examiner

*Primary Examiner* — Hoa B Trinh
(74) *Attorney, Agent, or Firm* — Slater Matsil, LLP

(57) ABSTRACT

A method includes forming a seed layer over a first conductive feature of a wafer, forming a patterned plating mask on the seed layer, and plating a second conductive feature in an opening in the patterned plating mask. The plating includes performing a plurality of plating cycles, with each of the plurality of plating cycles including a first plating process performed using a first plating current density, and a second plating process performed using a second plating current density lower than the first plating current density. The patterned plating mask is then removed, and the seed layer is etched.

20 Claims, 22 Drawing Sheets

REDISTRIBUTION LINES HAVING NANO COLUMNS AND METHOD FORMING SAME

PRIORITY CLAIM AND CROSS-REFERENCE

This application claims the benefit of the U.S. Provisional Application No. 63/030,619, filed on May 27, 2020, and entitled "Semiconductor Package Device with Copper Redistribution Layer Having Nano column Structure," which application is hereby incorporated herein by reference.

BACKGROUND

In the formation of integrated circuits, integrated circuit devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

A redistribution line may then be formed to connect to the top surface of the metal pad, followed by the formation of a second polymer layer over the redistribution line. An Under-Bump-Metallurgy (UBM) is formed extending into an opening in the second polymer layer, wherein the UBM is electrically connected to the redistribution line. A solder ball may be placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
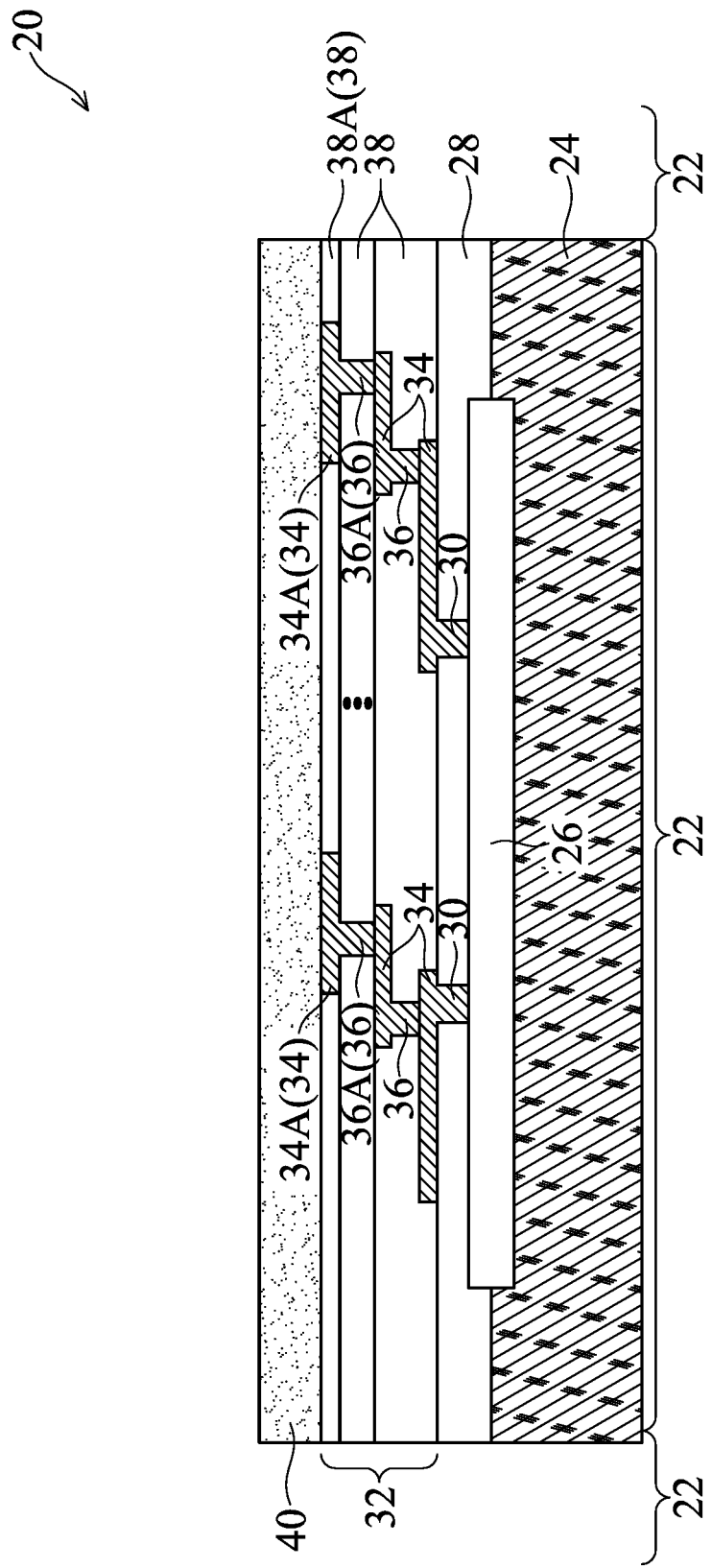
FIGS. 1 through 15 illustrate the cross-sectional views of intermediate stages in the formation of a device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device and the method of forming the same are provided in accordance with some embodiments. The device includes a redistribution line, which includes a conductive feature having a nano-column structure. The formation process of the conductive feature may include a plating process, in which a high plating current and a low plating current are alternated in a plurality of plating cycles to form nano sheets. The intermediate stages in the formation of the package are illustrated in accordance with some embodiments. Some variations of some embodiments are discussed. Throughout the various views and illustrative embodiments, like reference numbers are used to designate like elements.

Figure 22:
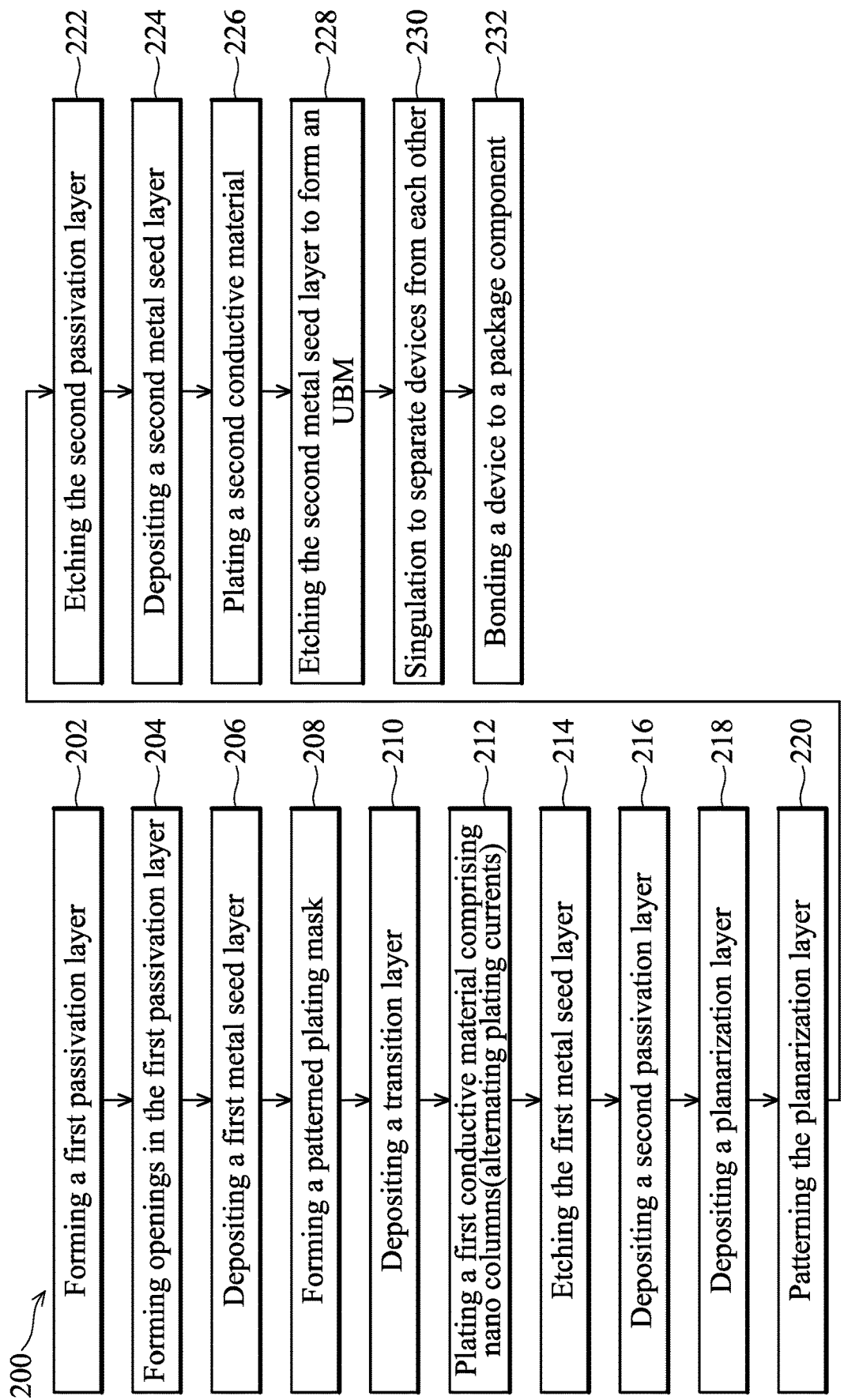
FIG. 22 illustrates a process flow for forming a device in accordance with some embodiments.

FIGS. 1 through 15 illustrate the cross-sectional views of intermediate stages in the formation of a device in accordance with some embodiments of the present disclosure. The corresponding processes are also reflected schematically in the process flow 200 as shown in FIG. 22. It is appreciated that although a device wafer and a device die are used as examples, the embodiments of the present disclosure may also be applied to form conductive features in other devices (package components) including, and not limited to, package substrates, interposers, packages, and the like.

FIG. 1 illustrates a cross-sectional view of integrated circuit device 20. In accordance with some embodiments of the present disclosure, device 20 is or comprises a device wafer including active devices and possibly passive devices, which are represented as integrated circuit devices 26. Device 20 may include a plurality of chips/dies 22 therein, with one of chips 22 being illustrated. In accordance with alternative embodiments of the present disclosure, device 20 is an interposer wafer, which is free from active devices, and may or may not include passive devices. In accordance with yet alternative embodiments of the present disclosure, device 20 is or comprises a package substrate strip, which includes a core-less package substrate or a cored package substrate with a core therein. In subsequent discussion, a device wafer is used as an example of device 20, and device 20 may also be referred to as wafer 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys thereof and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38 and then performing a curing process to drive out the porogen, and hence the remaining dielectric layers 38 are porous.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 and vias include top conductive (metal) features such as metal lines (denoted as 34A), metal pads (also denoted as 34A), or vias (denoted as 36A in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A and 36A may also be formed of copper or a copper alloy, and may have a dual damascene structure or a single damascene structure. In accordance with some embodiments, top metal features 34A and 36A have a polycrystalline structure. Dielectric layer 38A is sometimes referred to as a top dielectric layer. The top dielectric layer 38A and the underlying dielectric layer 38 that is immediately underlying the top dielectric layer 38A may be formed as a single continuous dielectric layer, or may be formed as different dielectric layers using different processes, and/or formed of materials different from each other.

Passivation layer 40 (sometimes referred to as passivation-1 or pass-1) is formed over interconnect structure 32. The respective process is illustrated as process 202 in the process flow 200 as shown in FIG. 22. In accordance with some embodiments, passivation layer 40 is formed of a non-low-k dielectric material with a dielectric constant greater than the dielectric constant of silicon oxide. Passivation layer 40 may be formed of or comprise an inorganic dielectric material, which may include a material selected from, and is not limited to, silicon nitride ($SiN_x$), silicon oxide ($SiO_2$), silicon oxy-nitride ($SiON_x$), silicon oxy-carbide ($SiOC_x$), silicon carbide (SiC), or the like, combinations thereof, and multi-layers thereof. The value "x" represents the relative atomic ratio. In accordance with some embodiments, the top surfaces of top dielectric layer 38A and metal lines 34A are coplanar. Accordingly, passivation layer 40 may be a planar layer. In accordance with alternative embodiments, the top conductive features protrude higher than the top surface of the top dielectric layer 38A, and passivation layer 40 is non-planar.

Figure 2:
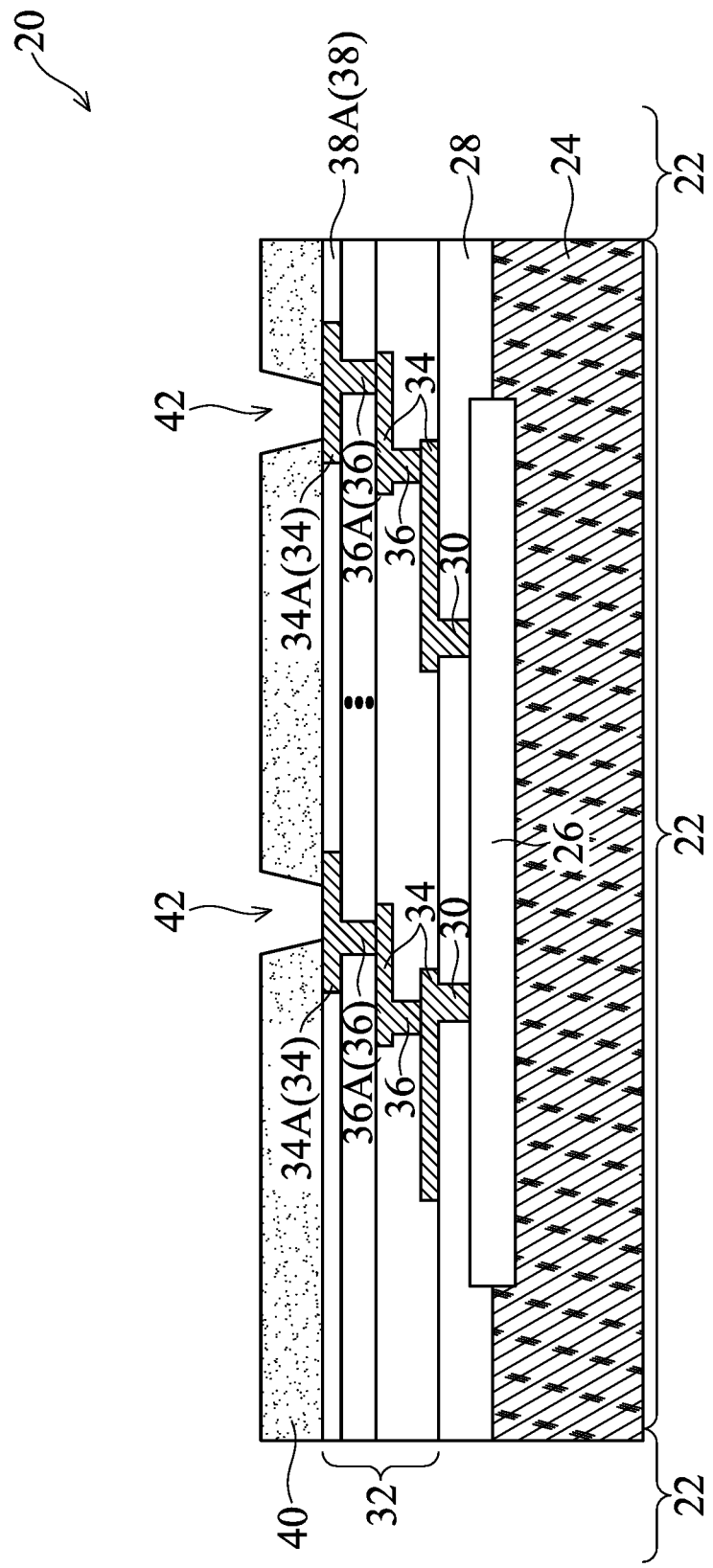

Referring to FIG. 2, passivation layer 40 is patterned in an etching process to form openings 42. The respective process is illustrated as process 204 in the process flow 200 as shown in FIG. 22. The etching process may include a dry etching process, which includes forming a patterned etching mask (not shown) such as a patterned photo resist, and then etching passivation layer 40. The patterned etching mask is then removed. Metal lines 34A are exposed through openings 42.

Figure 3:
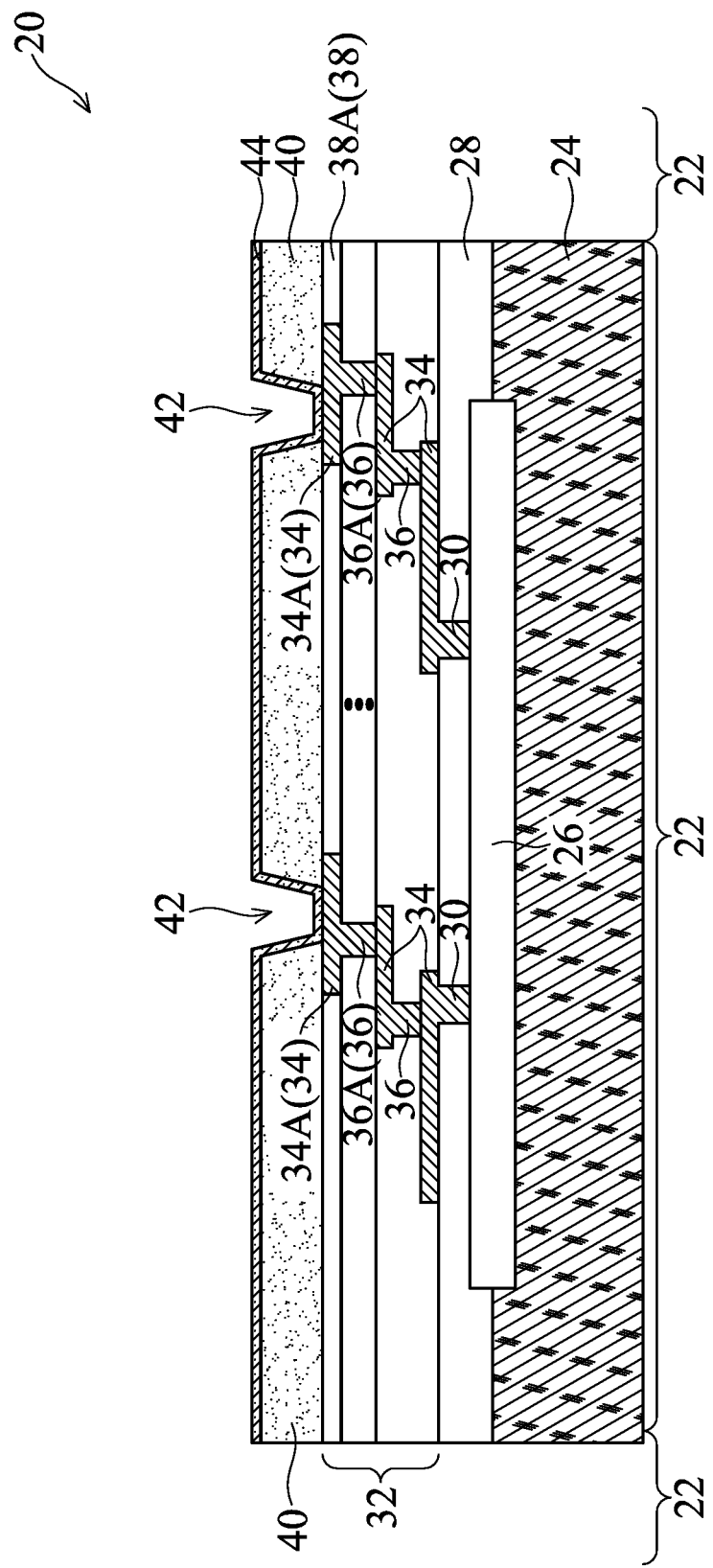

FIG. 3 illustrates the deposition of metal seed layer 44. The respective process is illustrated as process 206 in the process flow 200 as shown in FIG. 22. In accordance with some embodiments, metal seed layer 44 comprises a titanium layer and a copper layer over the titanium layer. In accordance with alternative embodiments, metal seed layer 44 comprises a copper layer in contact with passivation layer 40. The deposition process may be performed using Physical Vapor Deposition (PVD), Chemical Vapor Deposition (CVD), Metal Organic Chemical Vapor Deposition (MOCVD), or the like.

Figure 4:
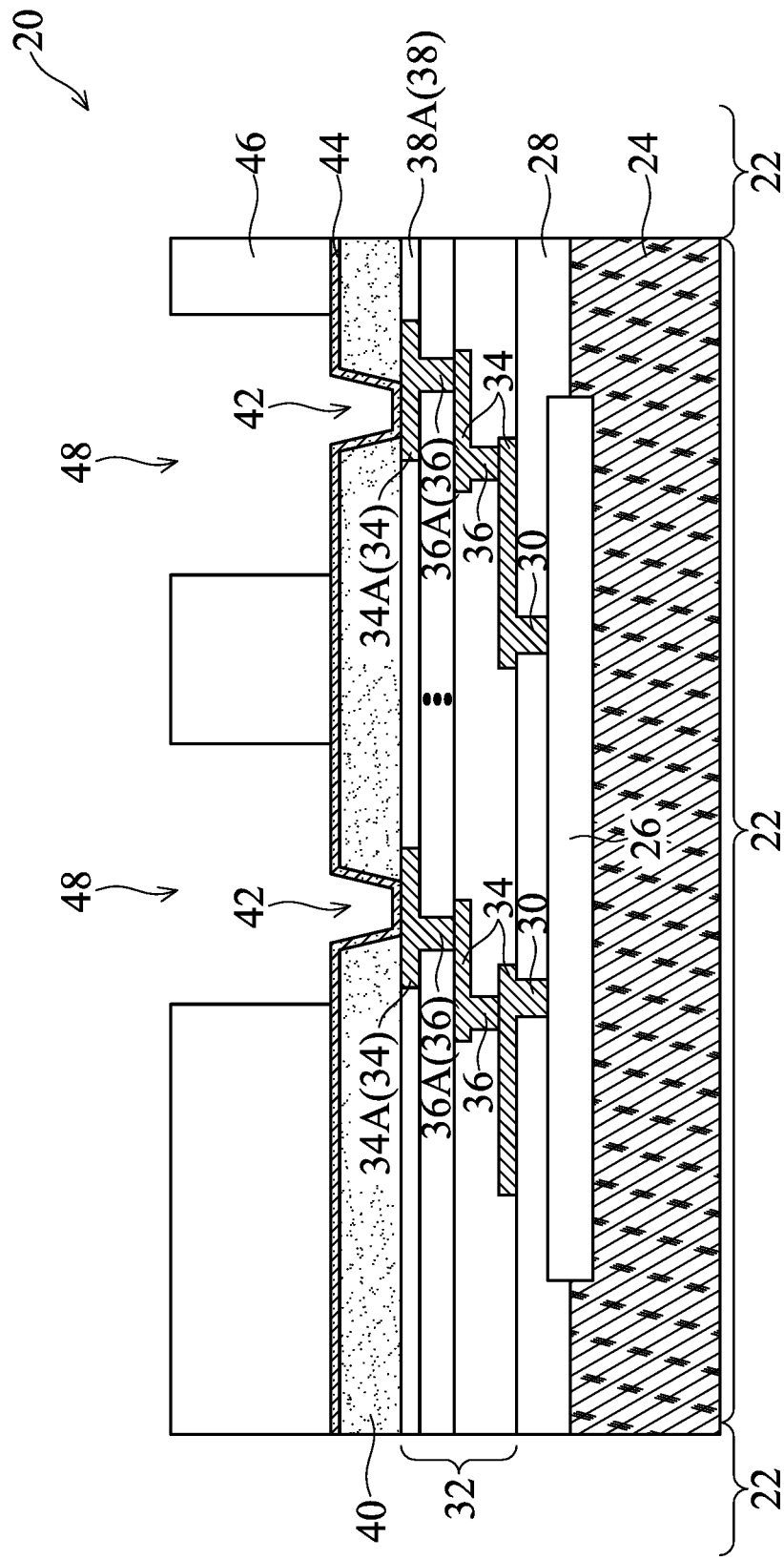

FIG. 4 illustrates the formation of patterned plating mask 46. The respective process is illustrated as process 208 in the process flow 200 as shown in FIG. 22. In accordance with some embodiments, plating mask 46 is formed of photo resist, and hence is alternatively referred to as photo resist 46. Openings 48 are formed in the patterned plating mask 46 to reveal metal seed layer 44.

Figure 5:
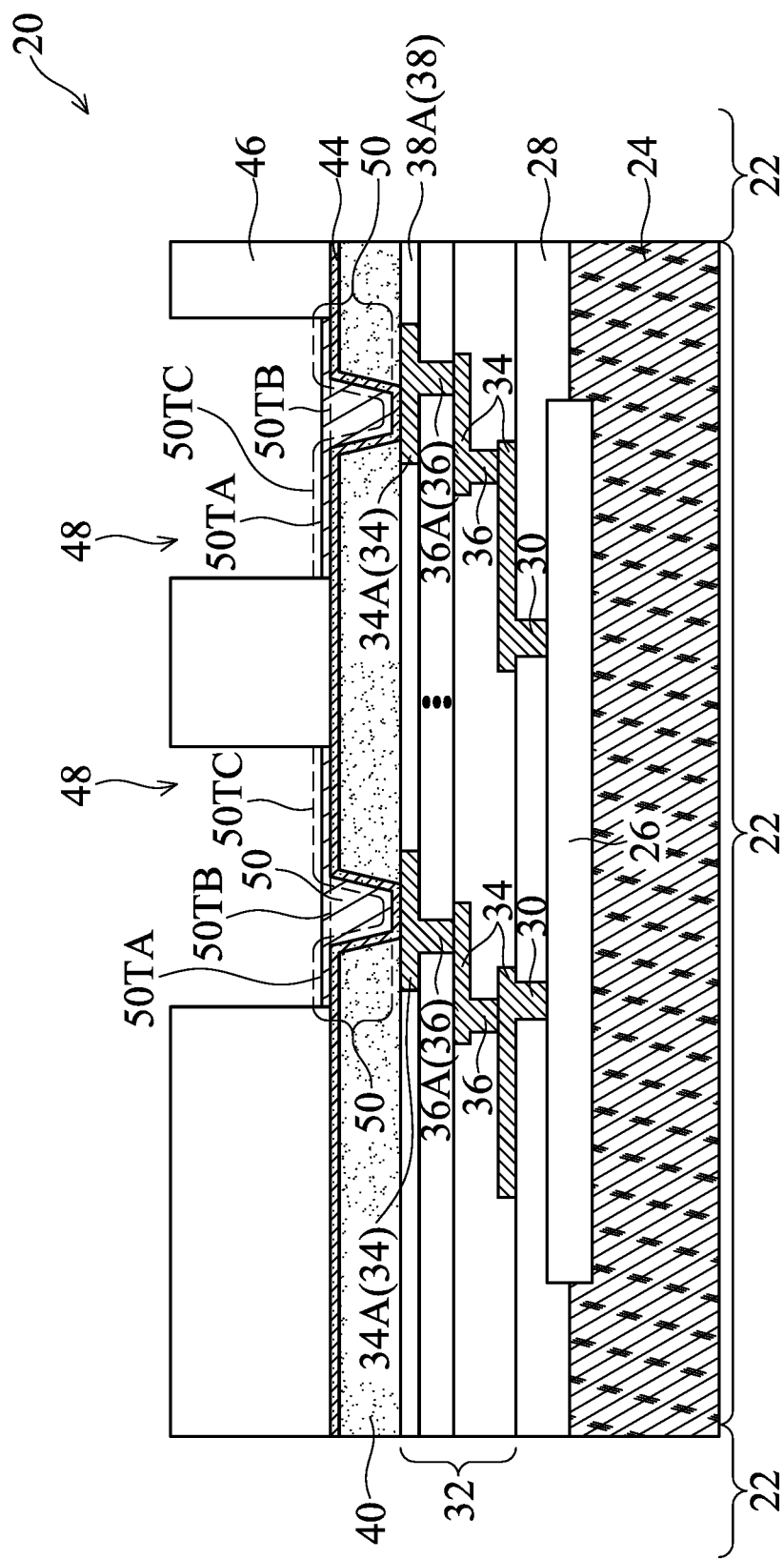

FIG. 5 illustrates the plating of polycrystalline transition layer 50. The respective process is illustrated as process 210 in the process flow 200 as shown in FIG. 22. In accordance with some embodiments of the present disclosure, the formation of polycrystalline transition layer 50 includes a plating process, which may include an electrochemical plating process. The plating is performed in a plating chemical solution, which may comprise the solution of $CuSO_4$. Accordingly, the resulting polycrystalline transition layer 50 may be formed of or comprise copper. The transition layer has several functions. Firstly, it may act as the seed layer for the subsequent formation of conductive features 52. Secondly, it may prepare for relatively planar top surfaces (compared to openings 42) for the subsequent plating process.

In accordance with some embodiments, polycrystalline transition layer 50 has a polycrystalline structure including a plurality of grains. The formation of polycrystalline transition layer 50 may be performed using a relatively small plating current density J1, for example, in a range between about 0.1 Amps per Square Decimeter (ASD) and about 4 ASD. The duration for plating the polycrystalline transition layer 50 may be in the range between about 2.5 seconds and about 80 seconds. In accordance with some embodiments, polycrystalline transition layer 50 fully fills openings 42, and may have a relatively planar top surface as shown as top surface 50TA. In accordance with some embodiments, for example, when openings 42 are deep, polycrystalline transition layer 50 may fully fill openings 42, and has little deposited on the top surfaces of high portions of metal seed layer 44, which high portions are over the top surface of passivation layer 40. In accordance with these embodiments, the top surface of polycrystalline transition layer 50 is substantially at the position as marked as 50 TB. In accordance with yet alternative embodiments, polycrystalline transition layer 50 has a non-planar top surface, which may be conformal or non-conformal, and the formation of the polycrystalline transition layer 50 is stopped before openings 42 are fully filled. The top surfaces of the corresponding polycrystalline transition layer 50 may be shown as 50TC.

Figure 6:
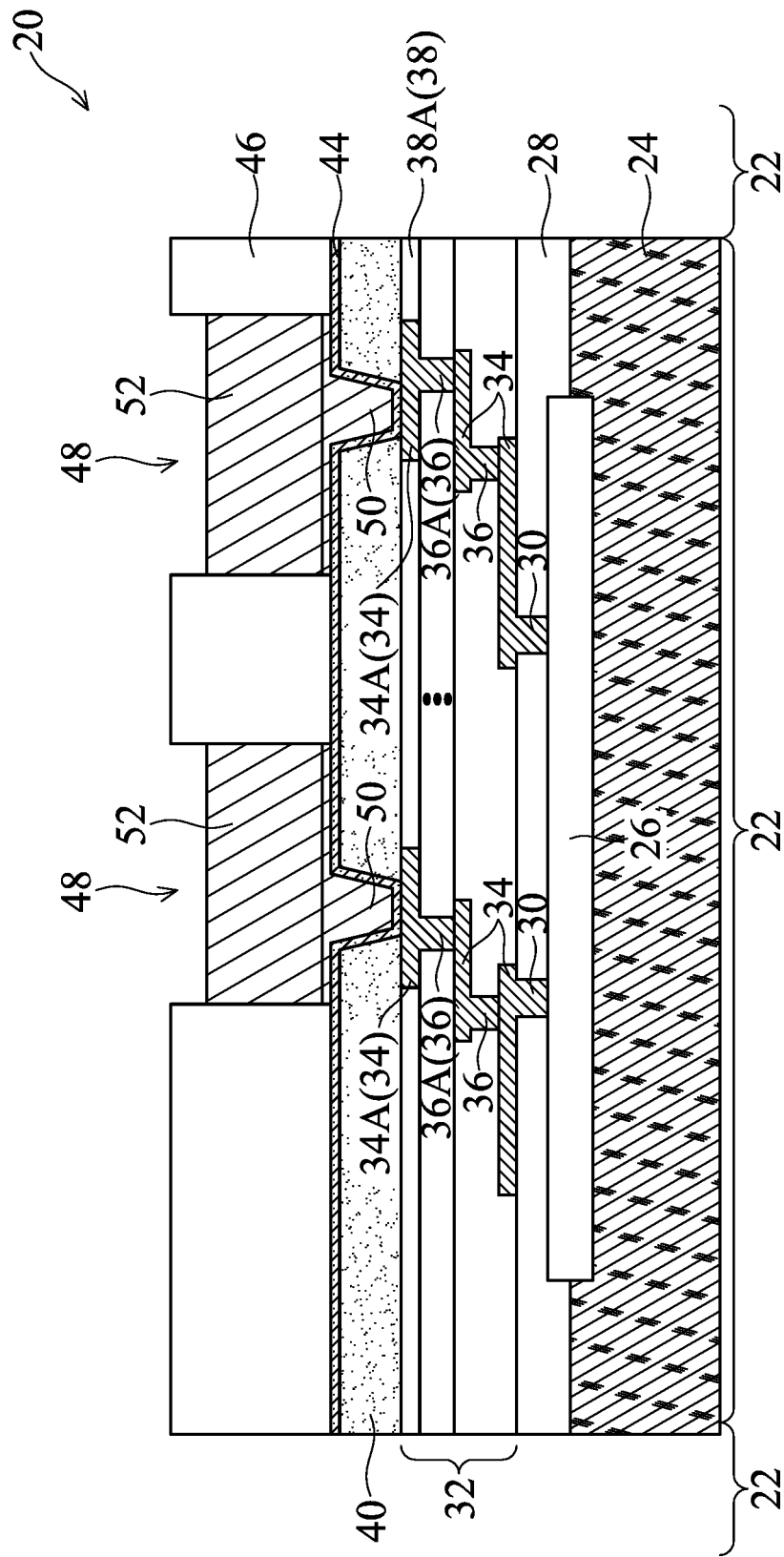

FIG. 6 illustrates the plating of conductive material (features) 52 into openings 48 and on top of polycrystalline transition layer 50. The respective process is illustrated as process 212 in the process flow 200 as shown in FIG. 22. The detailed structures and the formation processes are discussed in detail referring to FIGS. 16, 17, 18, and 19, which illustrate various views and the processes.

Figure 16:
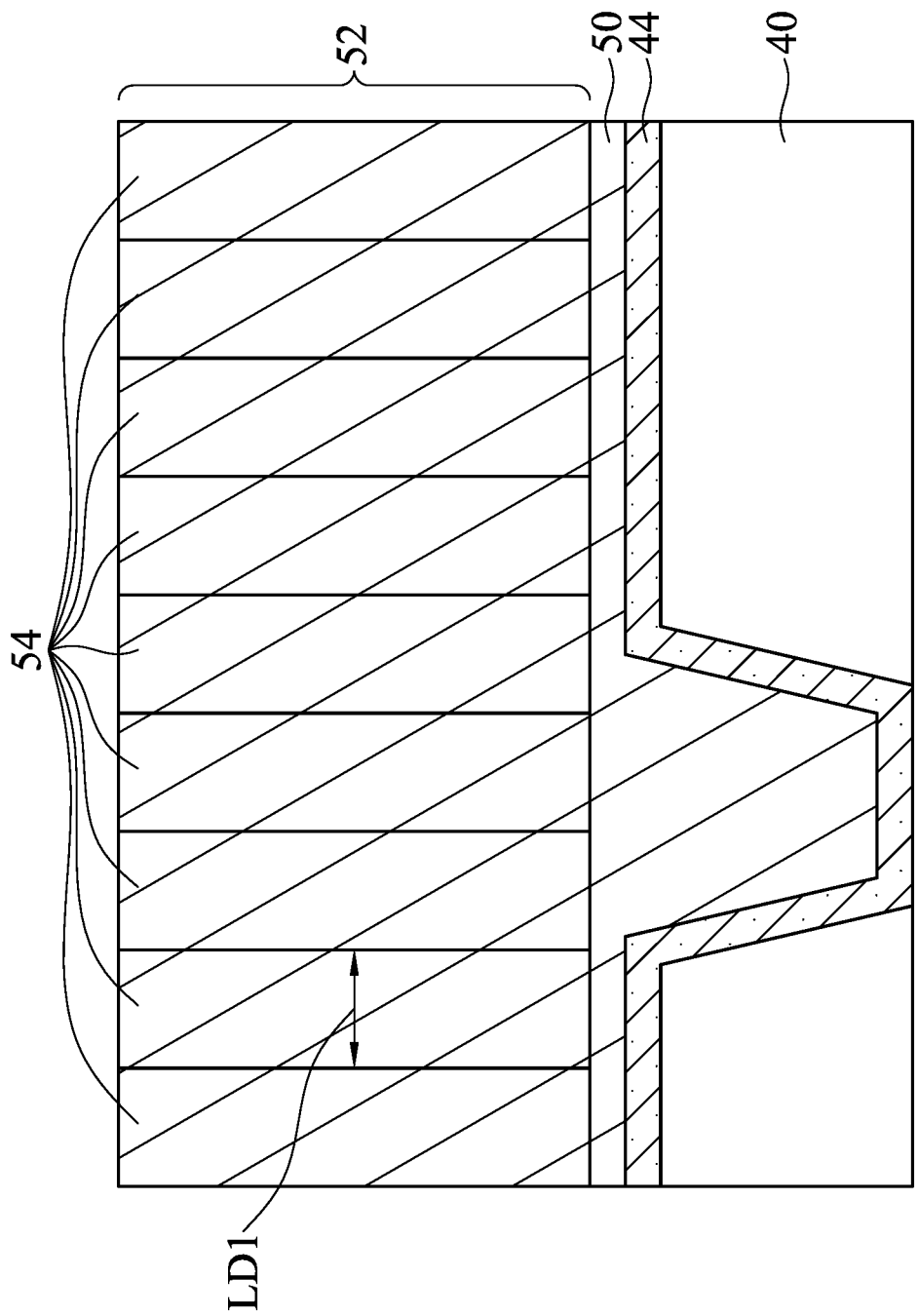
FIG. 16 illustrates a schematic cross-sectional view of nano columns in redistribution lines in accordance with some embodiments.

FIG. 16 illustrates a part of the structure shown in FIG. 6. The illustrated part includes conductive feature 52, which further includes a plurality of nano columns 54 therein. The nano columns 54 may have the lateral dimension LD1 (width or length) in the range between about 200 nm and about 2,000 nm. Nano columns 54 are such named since nano columns 54 are elongated in the vertical direction and form columns in nano scale. The nano columns 54 have boundaries that are clear distinguishable, for example, when viewed in X Ray Diffraction (XRD) images or Electron Back Scatter Diffraction (EBSD) images. Nano columns 54 may extend all the way from the top surface of polycrystalline transition layer 50 to the top surface of conductive feature 52 or in other ways, as will be discussed detail in subsequent paragraphs. The edges of nano columns 54 are substantially vertical, and may, or may not, be slightly curved or tilted, with the general trend being upward.

Figure 17:
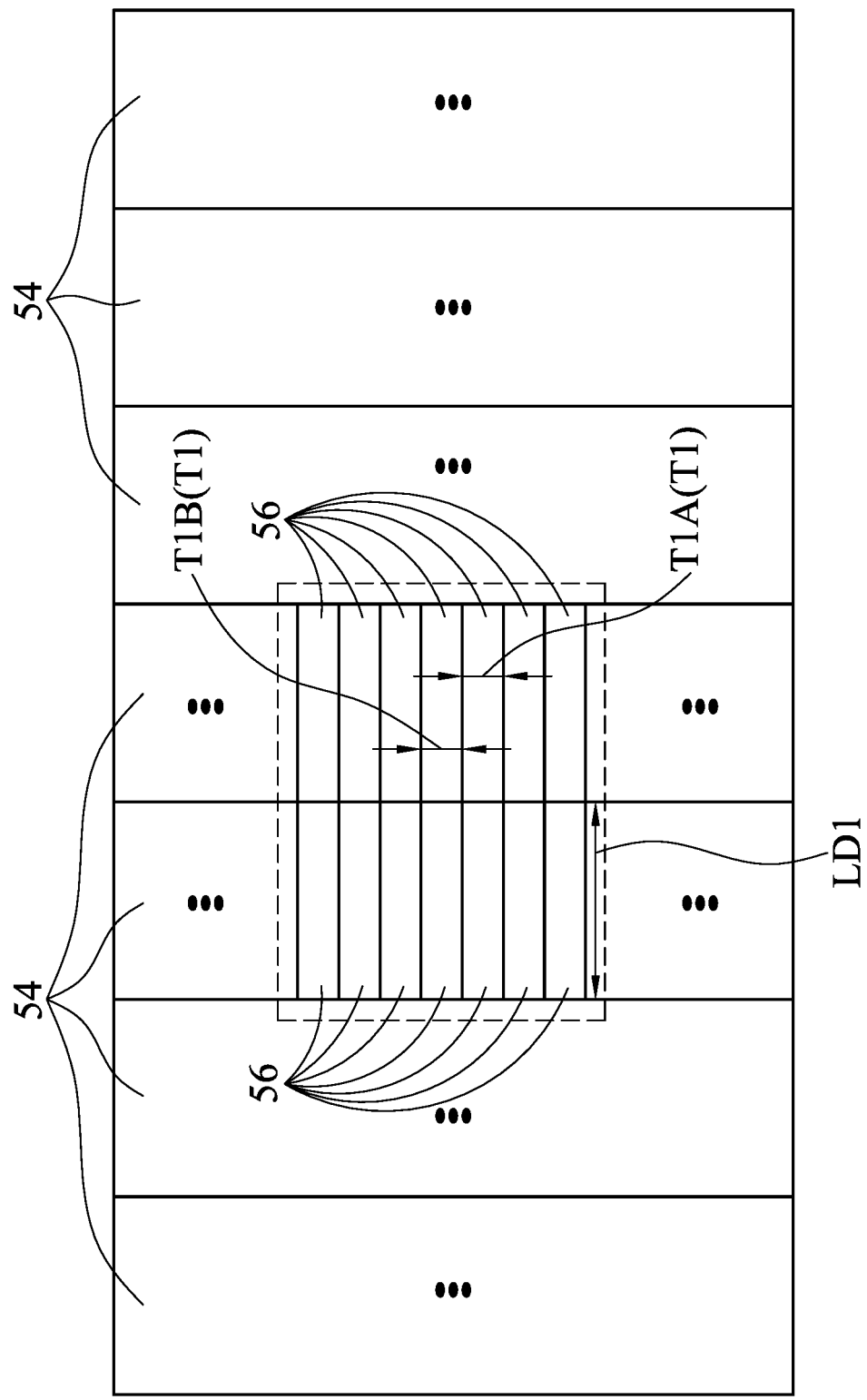
FIG. 17 illustrates a schematic cross-sectional view of nano columns and the corresponding nano plates in the nano columns in accordance with some embodiments.

FIG. 17 illustrates more details in some of nano columns 54. The details of a middle part of the illustrated portions are shown. The other portions, although do not have the details illustrated, may have similar structures as the illustrated portions. In accordance with some embodiments, each of nano columns 54 includes a plurality of nano plates 56 stacked up to form the nano column. The nano plates 56 have interfaces that are clearly distinguishable, for example, when viewed in XRD images or EBSD images. In the cross-sectional view, nano plates 56 are elongated, with the lateral dimension LD1 significantly greater than the corresponding thicknesses T1. For example, the ratio LD1/T1 of nano plates 56 may be greater than about 5, and may be in the range between about 5 and 40, wherein lateral dimension LD1 of nano plates 56 is also the lateral dimension of nano columns 54 (FIG. 16). In accordance with some embodiments, thicknesses T1 of nano plates 56 are in the range between about 5 nm and about 400 nm, and lateral dimension LD1 is in the range between about 200 nm and about 2,000 nm. The thicknesses T1 of different nano plates 56 may be the same or different from each other. For example, the ratio T1A/T1B, which is the thickness ratio of two neighboring nano plates 56, may be in the range between about 0.25 and about 80, and may also be in the range between about 0.8 and about 8. Ratio T1A/T1B may be equal to 1.0 also. Furthermore, the ratio of the greatest thickness of the nano plates 56 to the smallest thickness of the nano plates 56 in any nano column 54 may be smaller than about 80. The top and bottom surfaces of nano plates 56 in one nano column 54 may be level with, higher than, or lower than (in a random way) the top and bottom surfaces of their contacting nano plates 56 in neighboring nano columns 54, as schematically illustrated in FIG. 17.

In accordance with some embodiments, all of the nano columns 54 have clearly distinguishable edges (for example, in XRD images or EBSD images) contacting the edges of the neighboring nano columns. The edges are also substantially vertical. In other embodiments, most of the nano columns have clearly distinguishable edges (which are substantially vertical) to separate them from the neighboring nano columns, while a small amount (for example, less than 5 percent or 1 percent) of nano plates 56 may extend into neighboring nano columns 54. For example, some of the nano plates 56 in two neighboring nano columns 54 may merge with each other with no distinguishable edges separating them from each other.

Figure 18:
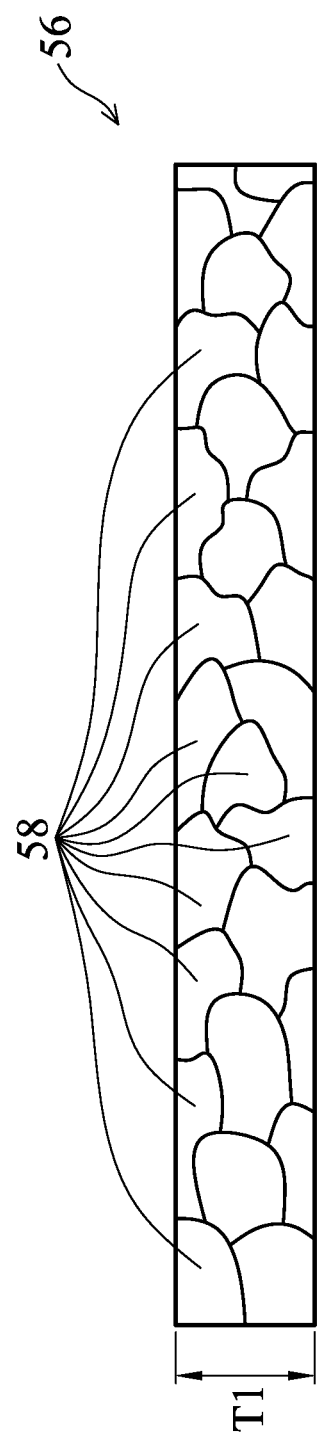
FIG. 18 illustrates a cross-sectional view of a nano plate in accordance with some embodiments.

FIG. 18 illustrates the cross-sectional view of an example nano plate 56, which is a larger grain larger than grains 58. In accordance with some embodiments, nano plate 56 has a polycrystalline structure including a plurality of grains 58 therein. Each of the grains 58 has a crystalline structure, which is different from and/or misaligned from the crystalline structure of its neighboring grains to form boundaries. The grains 58 inside nano plate 56 may have shapes different from each other and sizes different from each other. The boundaries of the grains 58 inside nano plate 56 are irregular (random without repeating patterns), and are not aligned to each other. The top surfaces of the top grains 58 inside nano plate 56, however, are aligned to each other (coplanar) to form a planar surface, which also forms a planar interface with its overlying nano plate 56. For example, the top surfaces of top grains 58 have height variations smaller than about 5 percent, or smaller than about 2 percent, of the thickness T1. The bottom surfaces of the top grains 58 inside nano plate 56 are also aligned to each other to form a planar surface. The bottom surfaces of bottom grains 58 may also be coplanar, for example, with height variations smaller than about 5 percent, or smaller than about 2 percent, of the thickness T1. The edges of the grains 50 on the sidewalls of nano plate 56 are also substantially aligned to form substantially vertical edges, for example, with offsets smaller than about 10 percent of the thickness T1. Accordingly, in the cross-sectional view, nano plate 56 may have a rectangular shape with clearly distinguishable boundaries.

The majority of grains 58 may have a same lattice direction, which may be in (111) crystal plane. In accordance with some embodiments, more than 85 volume percent of grains 58 are (111) oriented, while the rest of the volume percent of grains 58 have other lattice orientations.

Figure 20:
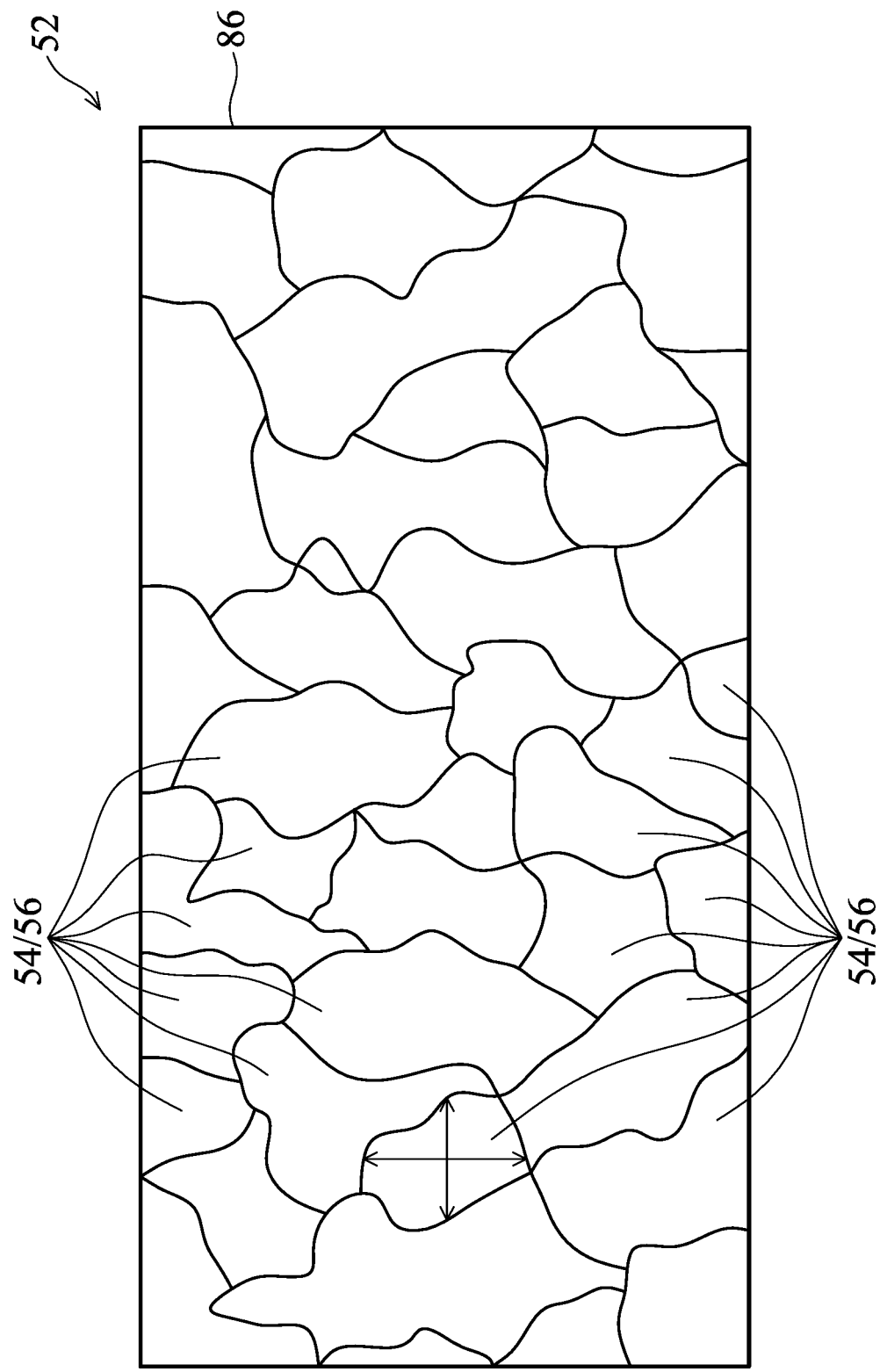
FIG. 20 illustrates a top view of the nano columns and nano plates in a redistribution line in accordance with some embodiments.

FIG. 20 illustrates a top view of a portion of conductive feature 52, in which a plurality of nano columns 54 are arranged next to and joining with each other. The nano plates 56 in the same nano column 54 may have the same (or similar) top-view shape and the same (or similar) top-view sizes, which are also the top-view shape and the top-view size, respectively, as the respective nano column 54 formed by these nano plates 56.

As shown in FIGS. 18, 17, and 16, a plurality of grains 58 collectively form polycrystalline nano plates 56, which have clear top surfaces, bottom surface, and edges that are formed due to the alignment of outer surfaces of the outer grains 58. A plurality of nano plates 56 is stacked to form a nano column 54. A plurality of nano columns 54 are further arranged to form conductive features 52. In accordance with some embodiments, all of the nano columns 54 include nano plates therein. In accordance with alternative embodiments, some (for example, more than 80 percent or 90 percent) of the nano columns 54 include nano plates 56 therein. These nano columns 54 are referred to as stacked nano columns hereinafter. There may be, or may not be, nano columns 54 that do not have stacked nano plates 56 therein, and the corresponding nano columns 54 are referred to as non-stacking nano columns 54 hereinafter. The non-stacking nano columns 54 also have polycrystalline structures including a plurality of grains 58 (refer to FIG. 18) therein. The non-stacking nano columns 54, however, do not have clear interfaces therein to divide the non-stacking nano columns 54 into stacked nano plates. Rather, the irregular pattern of grains 58 are distributed throughout the entire non-stacking nano columns 54.

In accordance with some embodiments, non-stacking nano columns 54 extend from the top surface of conductive feature 52 all the way to the top surface of polycrystalline transition layer 50, which has essentially the same structure as non-stacking nano columns 54, and hence these non-stacking nano columns 54 merge with polycrystalline transition layer 50 without forming distinguishable interfaces. In accordance with alternative embodiments, some of the nano columns 54 are divided into upper portions and lower portions, and the upper portions may be non-stacking nano columns 54, while the corresponding lower portions are stacking nano columns, or vice versa.

FIGS. 19A, 19B, 19C, and 19D illustrate the intermediate stages in the formation of nano plates 56 and a corresponding nano column 54 in accordance with some embodiments. It is appreciated that when the illustrated nano plates 56 and nano column 54 are formed, more nano plates 56 and nano columns 54 are formed simultaneously, so that conductive feature 52 is formed.

Figure 19A:
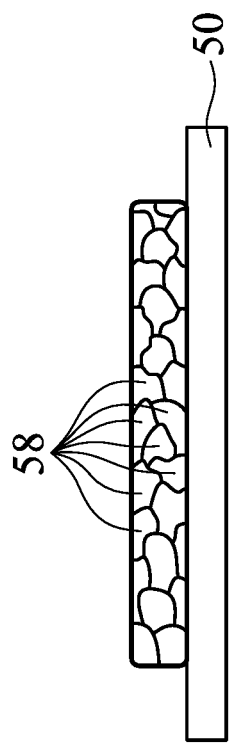
FIGS. 19A, 19B, 19C, and 19D illustrate cross-sectional views of intermediate stages in the formation of nano plates in a nano column in accordance with some embodiments.

Referring to FIG. 19A, polycrystalline transition layer 50 is formed, which process has been discussed refer to FIG. 5. It is appreciated that polycrystalline transition layer 50 are illustrated as having extension portions extending beyond the illustrated nano plate 56 and the corresponding nano column 54, while other nano plate 56 and nano column 54 are also formed (although not illustrated) on the extension portions of polycrystalline transition layer 50. The polycrystalline transition layer 50, as aforementioned, is plated using current density J1, which may be in the range between about 0.1 ASD and about 4 ASD. Depending on the plating current density, polycrystalline transition layer 50 may have a planar top surface, with the grains having their top surfaces coplanar and aligned to a same plane, when the plating current density is small, for example, close to about 0.1 ASD. When a higher current density (for example, higher than about 0.2 ASD) is used for plating polycrystalline transition layer 50, the top surfaces of the grains in the polycrystalline transition layer 50 may have rough (non-coplanar) top surfaces. In accordance with some embodiments when the top surfaces of the grains in polycrystalline transition layer 50 are non-coplanar, a lower plating current density J2 may be applied to shape the top surface of polycrystalline transition layer 50 to be planar. In accordance with some embodiments, the plating current J2 is in the range between about 0.05 ASD and about 0.2 ASD. The plating time may be in the range between about 5 seconds and about 15 seconds. The plating current J2 has the effect of shaping and planarizing the top surface of polycrystalline transition layer 50 through slow plating.

Figure 19B:
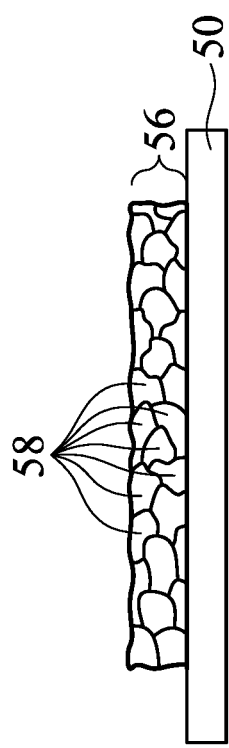

Next, a plurality of plating cycles are performed, each for forming a nano plate 56 (and other nano plates 56 at the same level). The plating may be performed in the same (or different) plating solution as for plating polycrystalline transition layer 50. In accordance with some embodiments, electrochemical plating process is used. Each plating cycle includes a high-current plating process followed by a low-current plating process. One of the cycles is illustrated in FIGS. 19A and 19B. Referring to FIG. 19A, a high-current plating process is performed to nano plate 56. The high-current plating process may have a current density J3 higher than, equal to, or slightly lower than, the current density J1 for plating polycrystalline transition layer 50, and higher than the current density J2 for planarizing the top surface of polycrystalline transition layer 50. In accordance with some embodiments, current density J 3 is in the range between about 2.0 ASD and about 6.0 ASD. The high-current plating may be performed for a period of time TP1 in the range between about 1 second and about 5 seconds.

As shown in FIG. 19A, the top surface of nano plate 56 is rough. Accordingly, the plating cycle further includes a small-current plating process for planarizing the top surface of nano plate 56. The small-current plating process is performed using current density J4, which is smaller than current density J3. The resulting nano plate 56 is shown in FIG. 19B. Current density J4 may also be smaller than current density J1 for plating polycrystalline transition layer 50, and may be in the same range as or equal to the current density J2 for shaping and planarizing the top surface of polycrystalline transition layer 50. In accordance with some embodiments, current density J4 is in the range between about 0.05 ASD and about 0.2 ASD. The duration TP2 of the low-current plating may be in the range between about 5 seconds and about 20 seconds. In the small-current plating process, although there may be some increase in the thickness of nano plate 56, the main effect is to grow the lower concave surfaces more than convex top surfaces, so that the resulting top surface of nano plate 56 is planar.

In accordance with some embodiments, a ratio of current J3/J4 (which ratio is also the ratio of the respective plating currents) may be in the range between about 10 and about 40. The ratio TP2/TP1 may be in the range between about 2 and about 10. Accordingly, the high-current plating process may be a high-current-short-duration plating process, and the low-current plating process may be a low-current-long-duration plating process. The plating process of conductive feature 52 thus includes the alternating high-current-short-duration plating processes and low-current-long-duration plating processes.

Figure 19C:
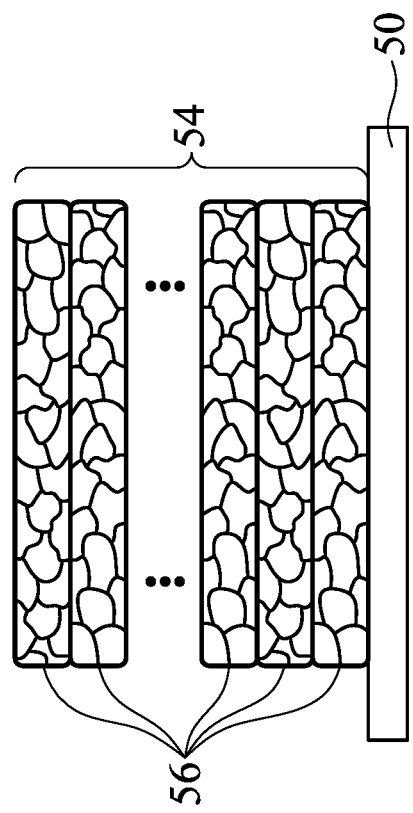

FIG. 19C illustrates a second plating cycle, resulting in the formation of a second nano plate 56 on the first nano plate 56. The second plating cycle may be performed using essentially the same process conditions for plating the first nano plate 56. In the plating of the second nano plate 56, the top surfaces of the first nano plate 56 act as the nuclei for the growth of the second nano plate 56. Hence, the edges of the upper nano plates 56 are grown along the edges of the corresponding lower nano plates 56, causing the nano columns to grow up vertically. With the top and bottom surfaces of nano plates 56 being aligned and planar, the interfaces between nano plates 56 are clearly distinguishable.

Figure 19D:
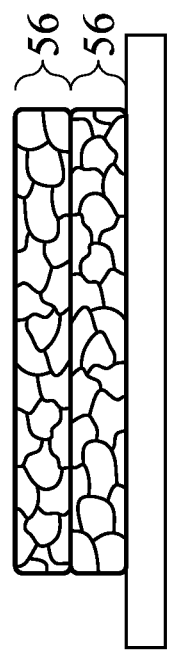

Referring to FIG. 19D, a plurality of plating cycles are performed using process conditions as discussed referring to FIGS. 19A and 19B, and hence more nano-sheets 56 are formed and stacked, resulting in the formation of nano column 54. As shown in FIG. 20, which is the top view of nano columns 54, the nano columns 54 in combination forms conductive features 52.

Figure 7:
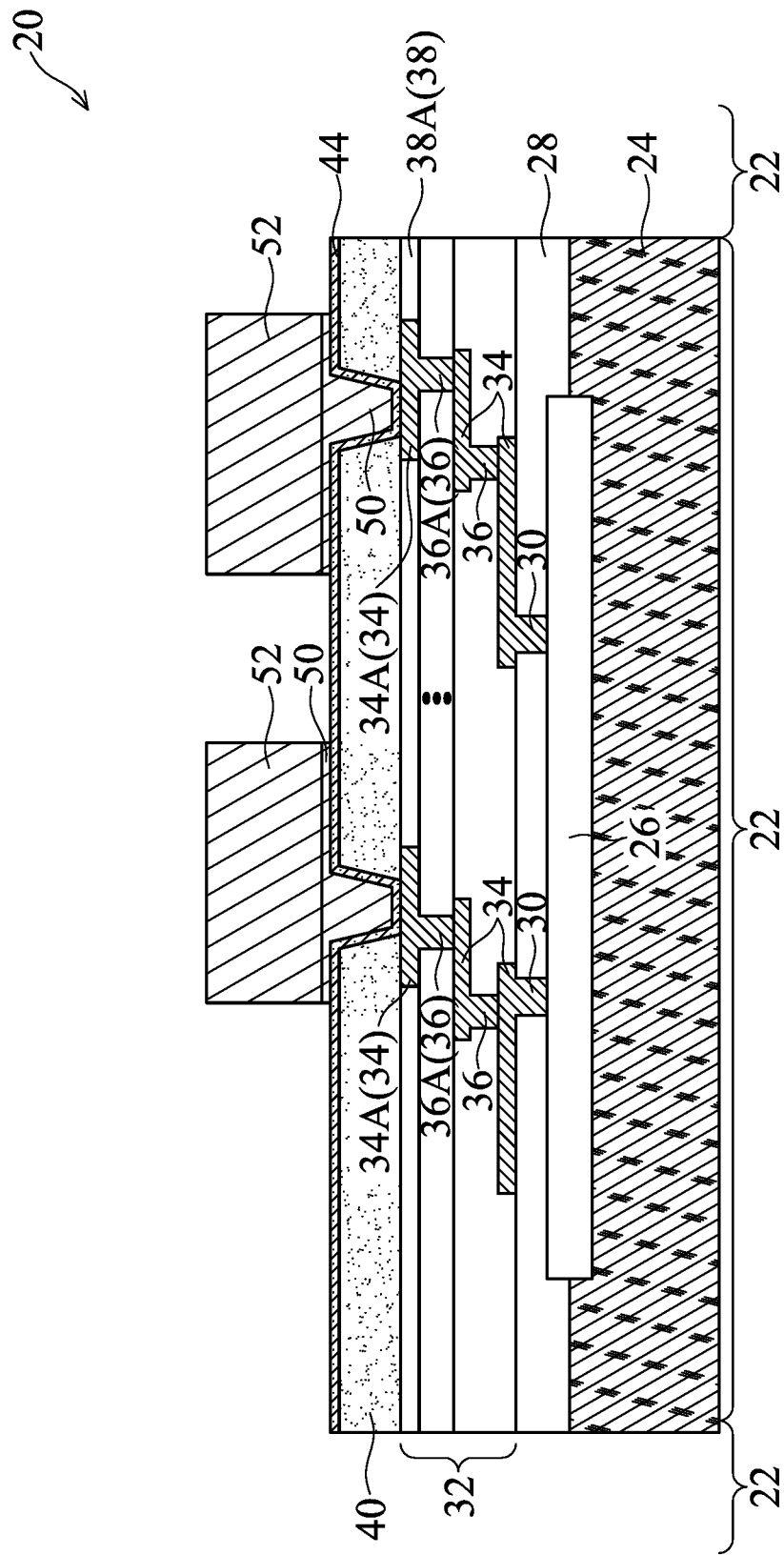
Figure 8:
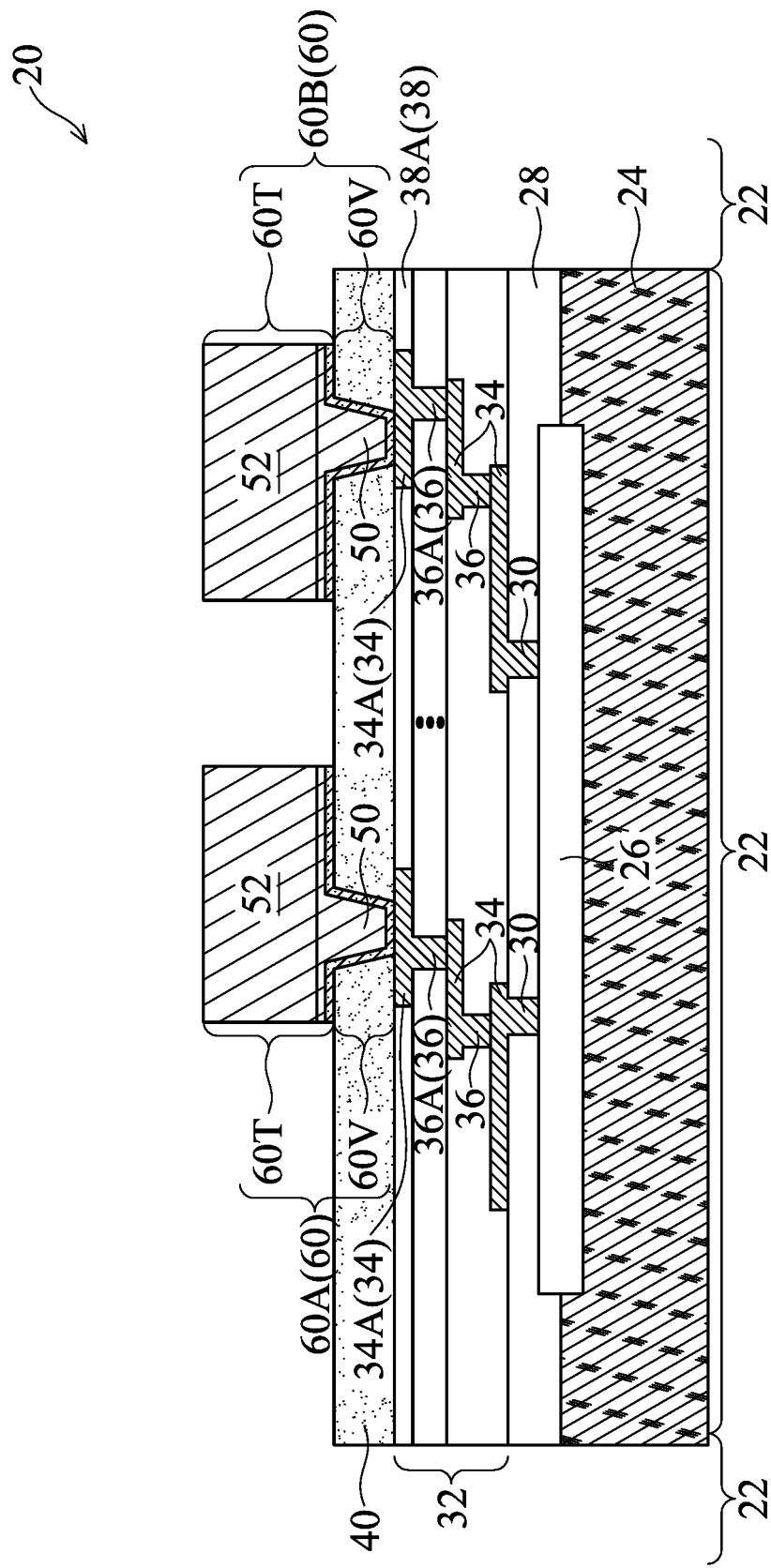

Next, photo resist (plating mask) 46 as shown in FIG. 6 is removed, and the resulting structure is shown in FIG. 7. In a subsequent process, an etching process is performed to remove the portions of metal seed layers 44 that are not protected by the overlying conductive features 52. The respective process is illustrated as process 214 in the process flow 200 as shown in FIG. 22. The resulting structure is shown in FIG. 8. Throughout the description, conductive features 52, polycrystalline transition layers 50, and the corresponding underlying metal seed layers 44 are collectively referred to Redistribution Lines (RDLs) 60, which includes RDL 60A and RDL 60B. Each of RDLs 60 may include a via portion 60V extending into passivation layer 40, and a trace/line portion 60T over passivation layer 40.

Figure 9:
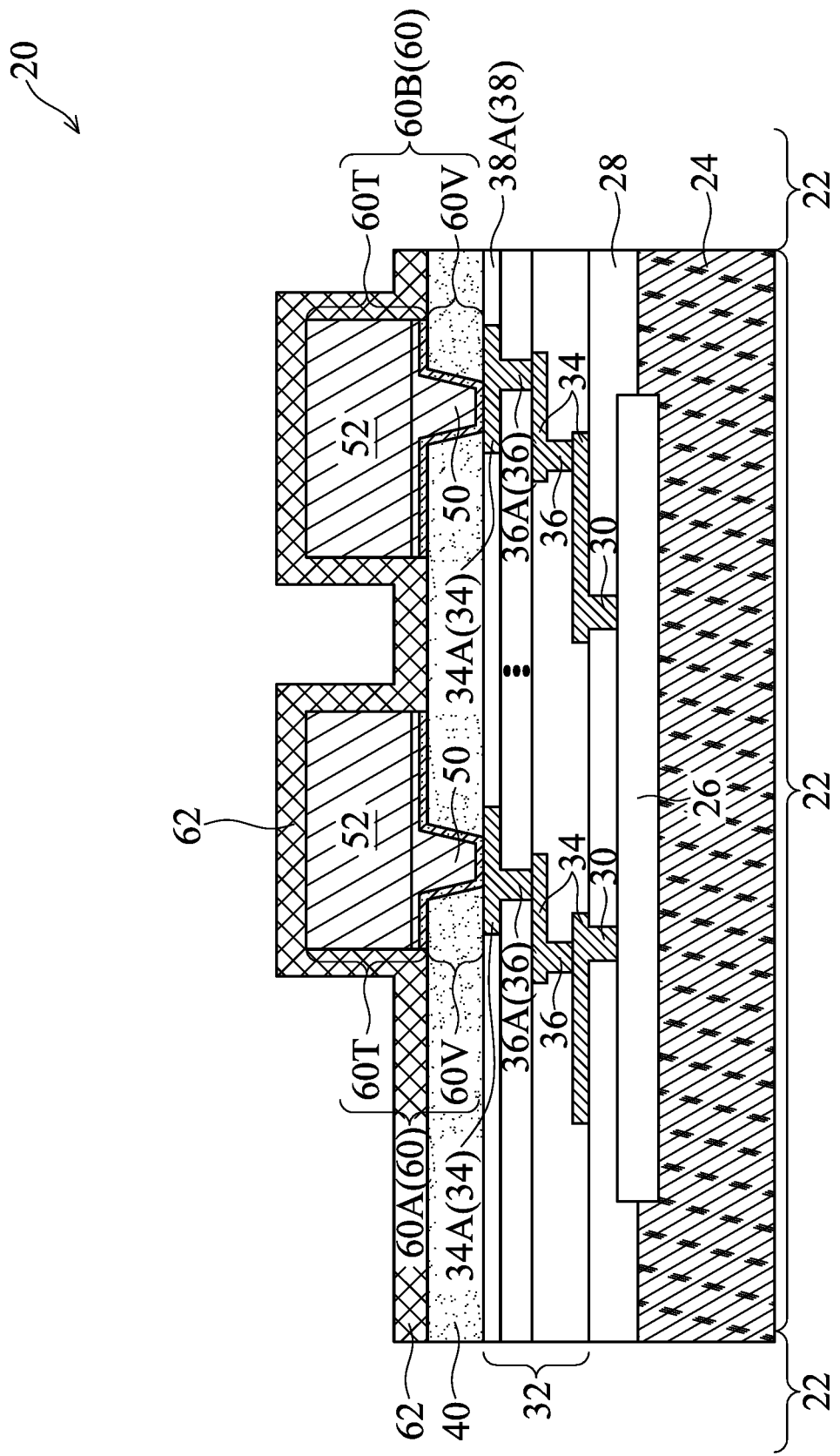

Referring to FIG. 9, passivation layer 62 is formed. The respective process is illustrated as process 216 in the process flow 200 as shown in FIG. 22. Passivation layer 62 (sometimes referred to as passivation-2 or pass-2) is formed as a blanket layer. In accordance with some embodiments, passivation layer 62 is formed of or comprises an inorganic dielectric material, which may include, and is not limited to, silicon nitride, silicon oxide, silicon oxy-nitride, silicon oxy-carbide, silicon carbide, or the like, combinations thereof, or multi-layers thereof. The material of passivation layer 62 may be the same or different from the material of passivation layer 40. The deposition may be performed through a conformal deposition process such as Atomic Layer Deposition (ALD), CVD, or the like. Accordingly, the vertical portions and horizontal portions of passivation layer 62 have the same thickness or substantially the same thickness, for example, with a variation smaller than about 20 percent or smaller than about 10 percent. It is appreciated that regardless of whether passivation layer 62 is formed of a same material as passivation layer 40 or not, there may be a distinguishable interface, which may be visible, for example, in a Transmission Electron Microscopy (TEM) image, an XRD image, or an EBSD image of the structure.

Figure 10:
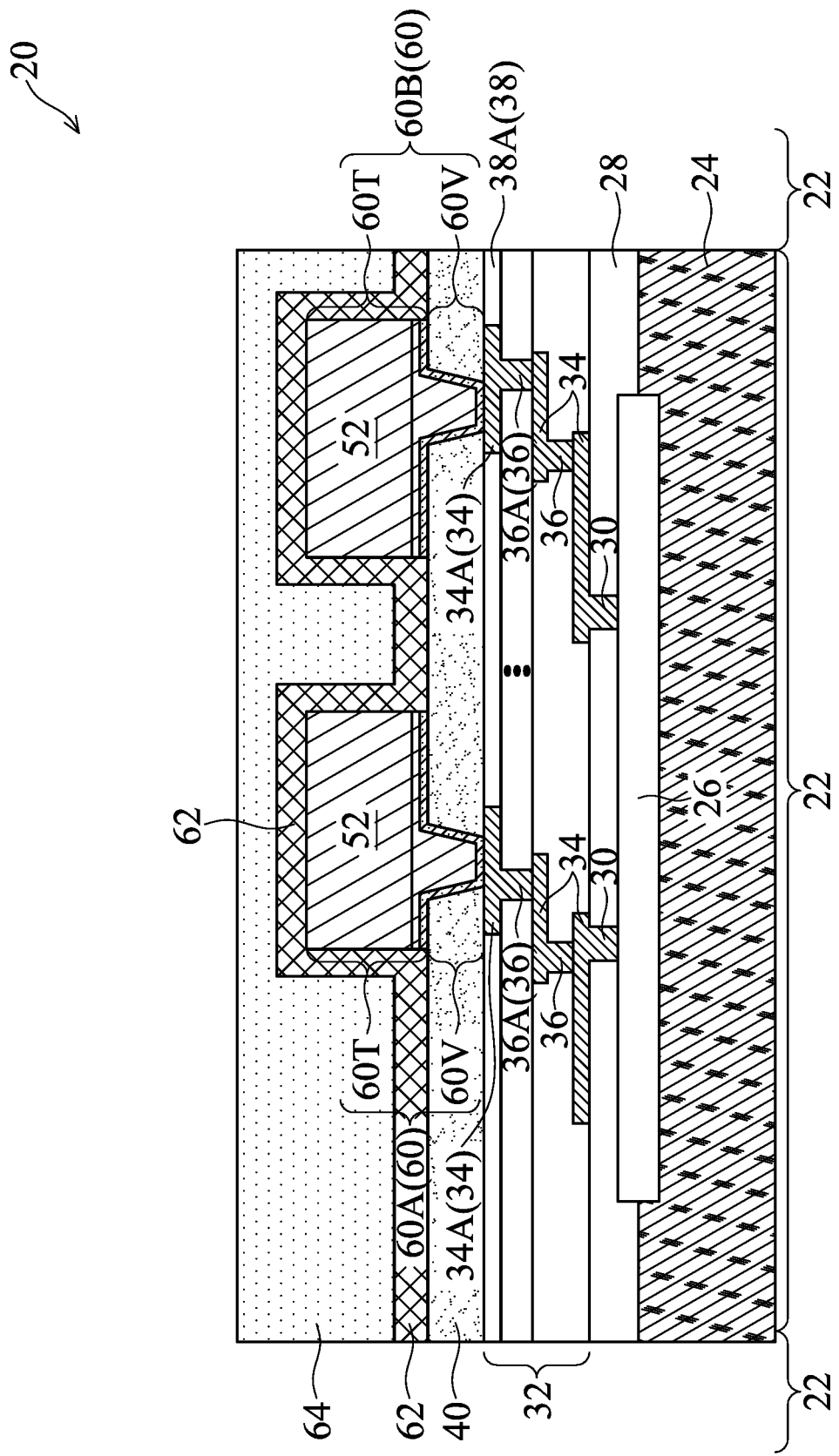

FIG. 10 illustrates the formation of planarization layer 64. The respective process is illustrated as process 218 in the process flow 200 as shown in FIG. 22. In accordance with some embodiments of the present disclosure, planarization layer 64 is formed of a polymer (which may be photosensitive) such as polyimide, polybenzoxazole (PBO), benzocyclobutene (BCB), an epoxy, or the like. In accordance with some embodiments, the formation of planarization layer 64 includes coating the planarization layer in a flowable form, and then baking to harden planarization layer 64. A planarization process such as a mechanical grinding process may be (or may not be) performed to level the top surface of planarization layer 64.

Figure 11:
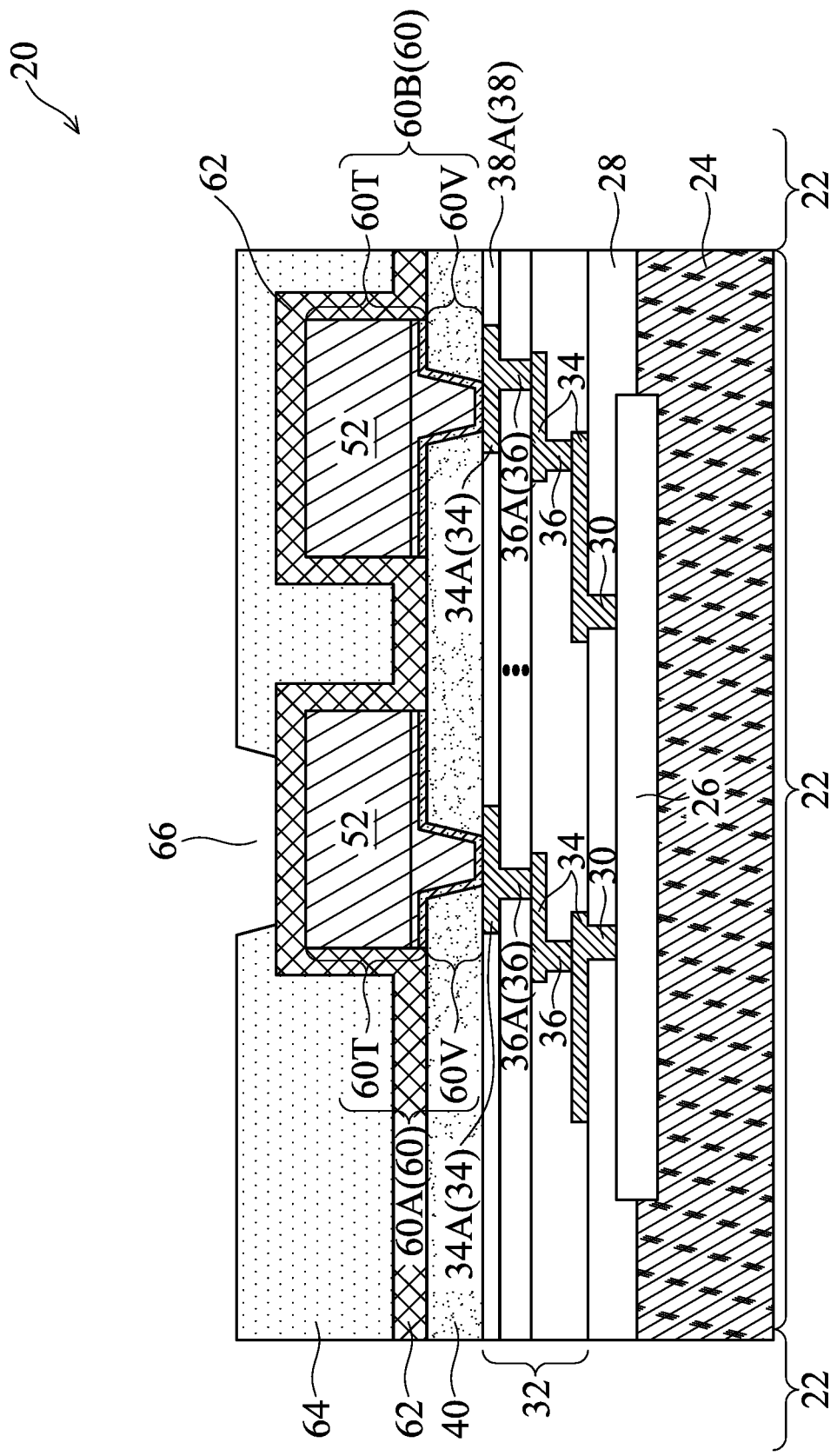

Referring to FIG. 11, planarization layer 64 is patterned, for example, through a light-exposure process followed by a development process. The respective process is illustrated as process 220 in the process flow 200 as shown in FIG. 22. Opening 66 is thus formed in planarization layer 64, and passivation layer 62 is exposed.

Figure 12:
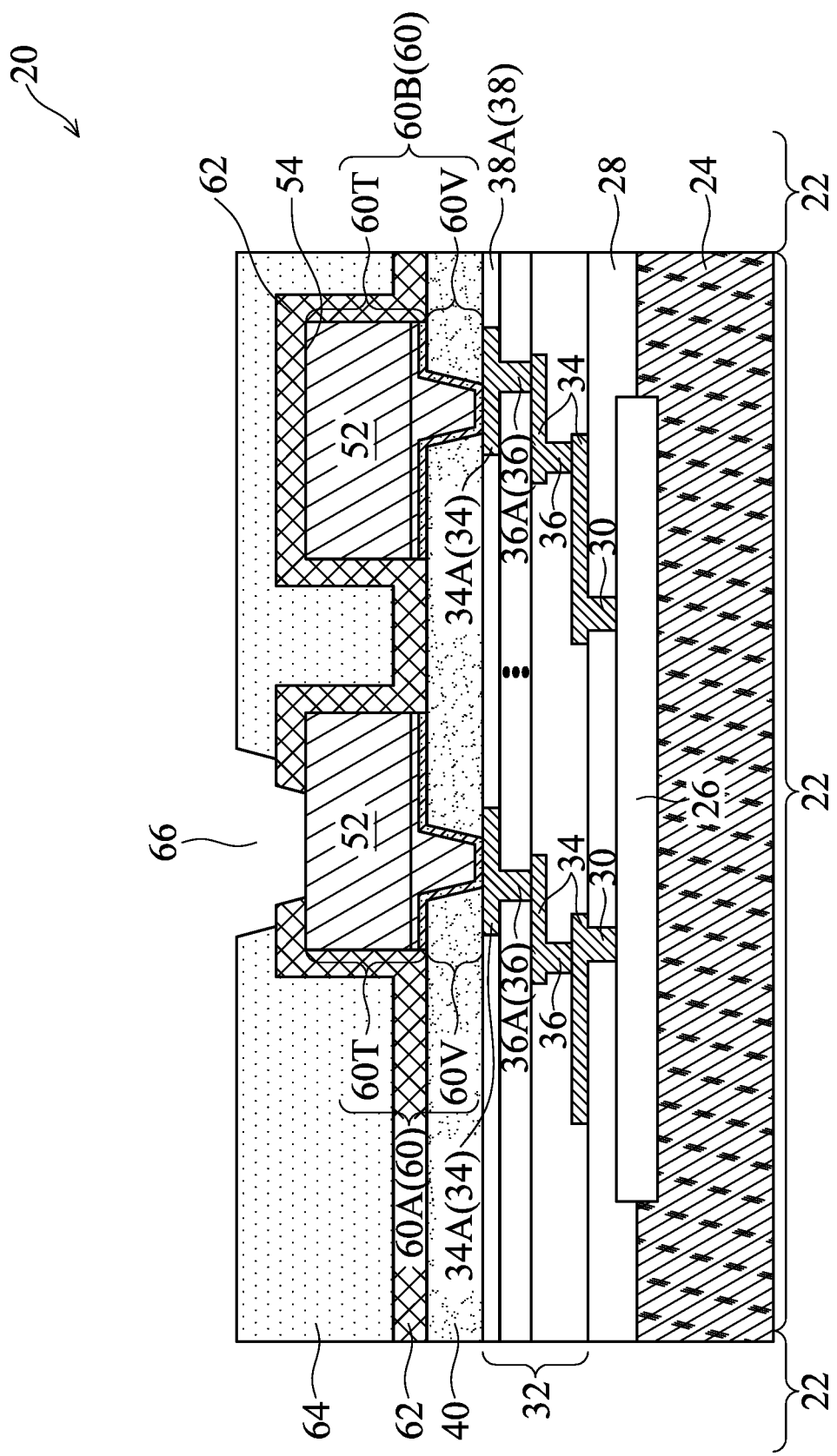

FIG. 12 illustrates the patterning of passivation layer 62 to extend opening 66 down. The respective process is illustrated as process 222 in the process flow 200 as shown in FIG. 22. In accordance with some embodiments, the patterning process of passivation layer 62 is performed using the patterned planarization layer 64 as an etching mask. In accordance with alternative embodiments, the patterning of passivation layer 62 includes forming an etching mask such as a photo resist (not shown), patterning the etching mask, and etching passivation layer 62 using the etching mask to define the pattern.

Figure 13:
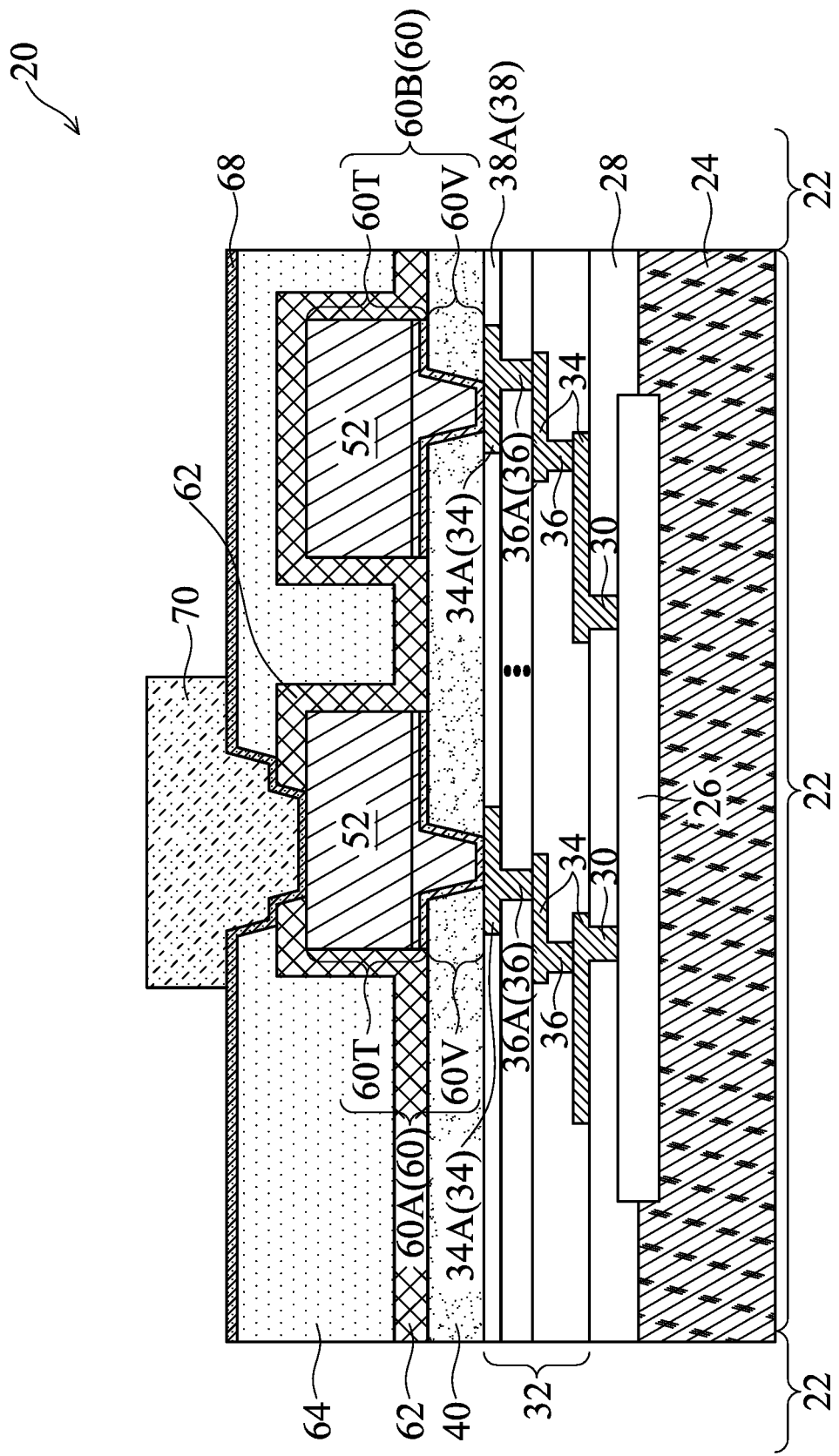

FIG. 13 illustrates the deposition of metal seed layer 68. The respective process is illustrated as process 224 in the process flow 200 as shown in FIG. 22. In accordance with some embodiments, metal seed layer 68 includes a titanium layer and a copper layer over the titanium layer. In accordance with alternative embodiments, metal seed layer 68 comprises a copper layer in contact with planarization layer 64, passivation layer 62, and the top surface of conductive feature 52.

Next, conductive region 70 is plated. The respective process is illustrated as process 226 in the process flow 200 as shown in FIG. 22. The process for plating conductive region 70 may include forming a patterned plating mask (a photo resist, for example, not shown), and plating conductive region 70 in an opening in the plating mask. The plating mask is then removed, leaving the structure as shown in FIG. 13. Conductive region 70 may comprise copper, nickel, palladium, aluminum, gold, alloys thereof, and/or multi-layers thereof. Conductive region 70 may include a copper region capped with solder, which may be formed of SnAg or like materials.

Figure 14:
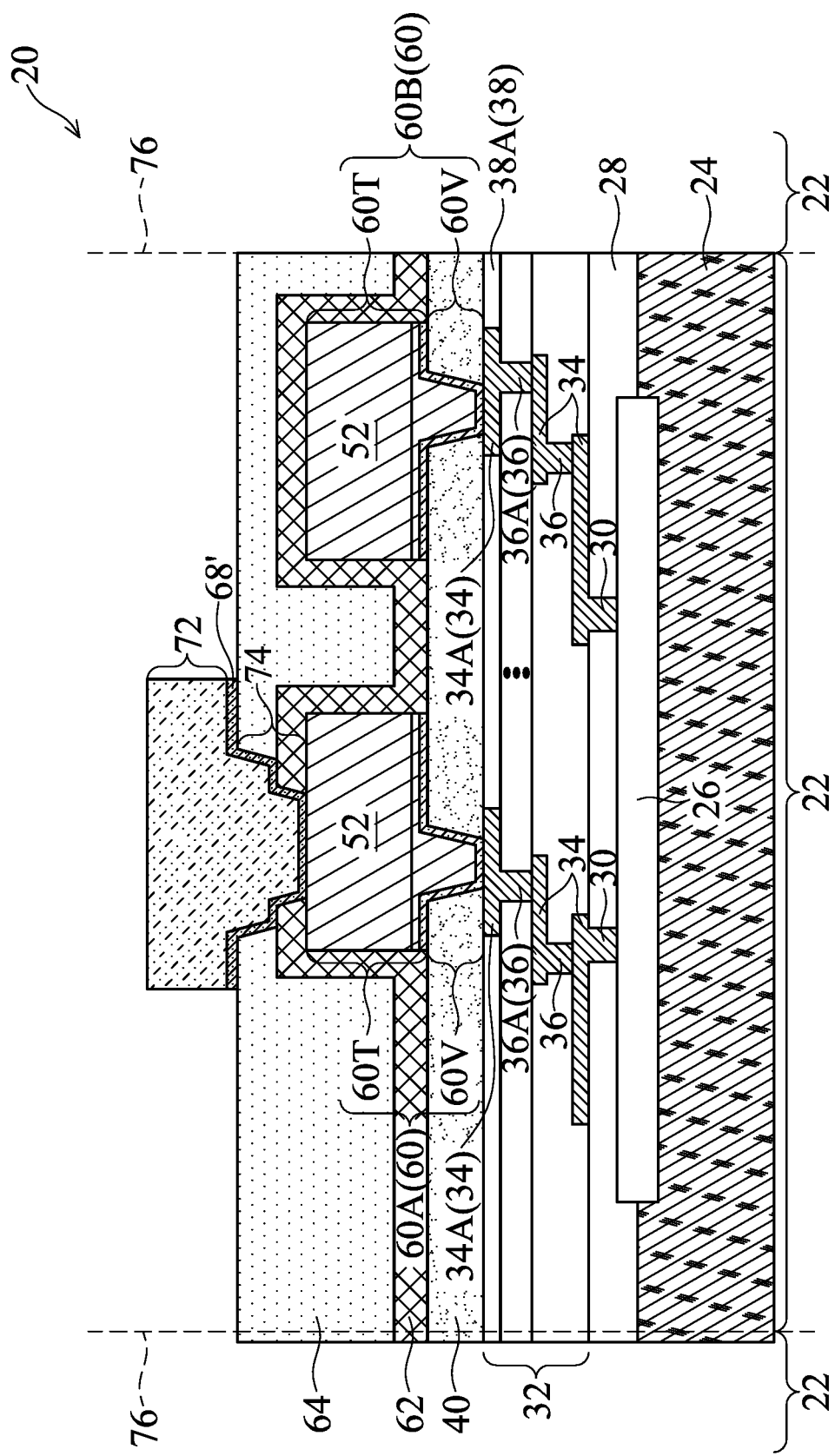

Metal seed layer 68 is then etched, and the portions of metal seed layer 68 that are exposed after the removal of the plating mask are removed, while the portions of metal seed layer 68 directly underlying conductive region 70 are left. The respective process is illustrated as process 228 in the process flow 200 as shown in FIG. 22. The resulting structure is shown in FIG. 14. A remaining portion of metal seed layer 68 is an Under-Bump Metallurgy (UBM) 68'. UBM 68' and conductive region 70 in combination form via 74 and electrical connector 72 (which is also referred to as a bump).

In accordance with some embodiments, via 74 and electrical connector 72 in combination include polycrystalline transition layer 71, and conductive feature 73 over polycrystalline transition layer 71. The structure and the formation method of polycrystalline transition layer 71 may be essentially the same as polycrystalline transition layer 50, and are not repeated herein. Conductive feature 73 may include nano columns 75, which may further include nano plates 77 therein, with the nano plates 77 drawn schematically for one of nano columns 75, while they may still be formed in other nano columns 75, although not shown. The structure and the formation method of conductive feature 73 may be essentially the same as that of conductive feature 52, and are not repeated herein. The details of the structure and the formation processes of the nano columns 75 and nano plates 77 may be essentially the same as that of nano columns 54 and nano plates 56, respectively, which are discussed referring to FIGS. 17, 18, 19A, 19B, 19C, 19D, and 20.

In accordance with some embodiments, as aforementioned, via 74 and electrical connector 72 include the nano columns and nano plates. Accordingly, via 74 and electrical connector 72 also have the function of redistributing stress, so that the delamination between the underlying features such as passivation layers and RDLs is further reduced. In accordance with alternative embodiments, when the RDLs 60 (having the nano columns and nano plates) is adequate in redistributing stress, and the risk of having the delamination is low, via 74 and electrical connector 72 may be formed, for example, by applying a uniform plating current density to reduce manufacturing cost and improve throughput. The resulting via 74 and electrical connector 72 may be free from nano columns and nano plates. In accordance with the respective embodiments, electrical connector 72 and via 74 may have an amorphous structure. In accordance with yet alternative embodiments, electrical connector 72 and via 74 may have a polycrystalline structure. The polycrystalline structure may have a random pattern that does not form nano plates and nano columns.

In a subsequent process, wafer 20 is singulated, for example, sawed along scribe lines 76 to form individual device dies 22. The respective process is illustrated as process 230 in the process flow 200 as shown in FIG. 22. Device dies 22 are also referred to as devices 22 or package components 22 since devices 22 may be used for bonding to other package components in order to form packages. As aforementioned, devices 22 may be device dies, interposers, package substrate, packages, or the like.

Figure 15:
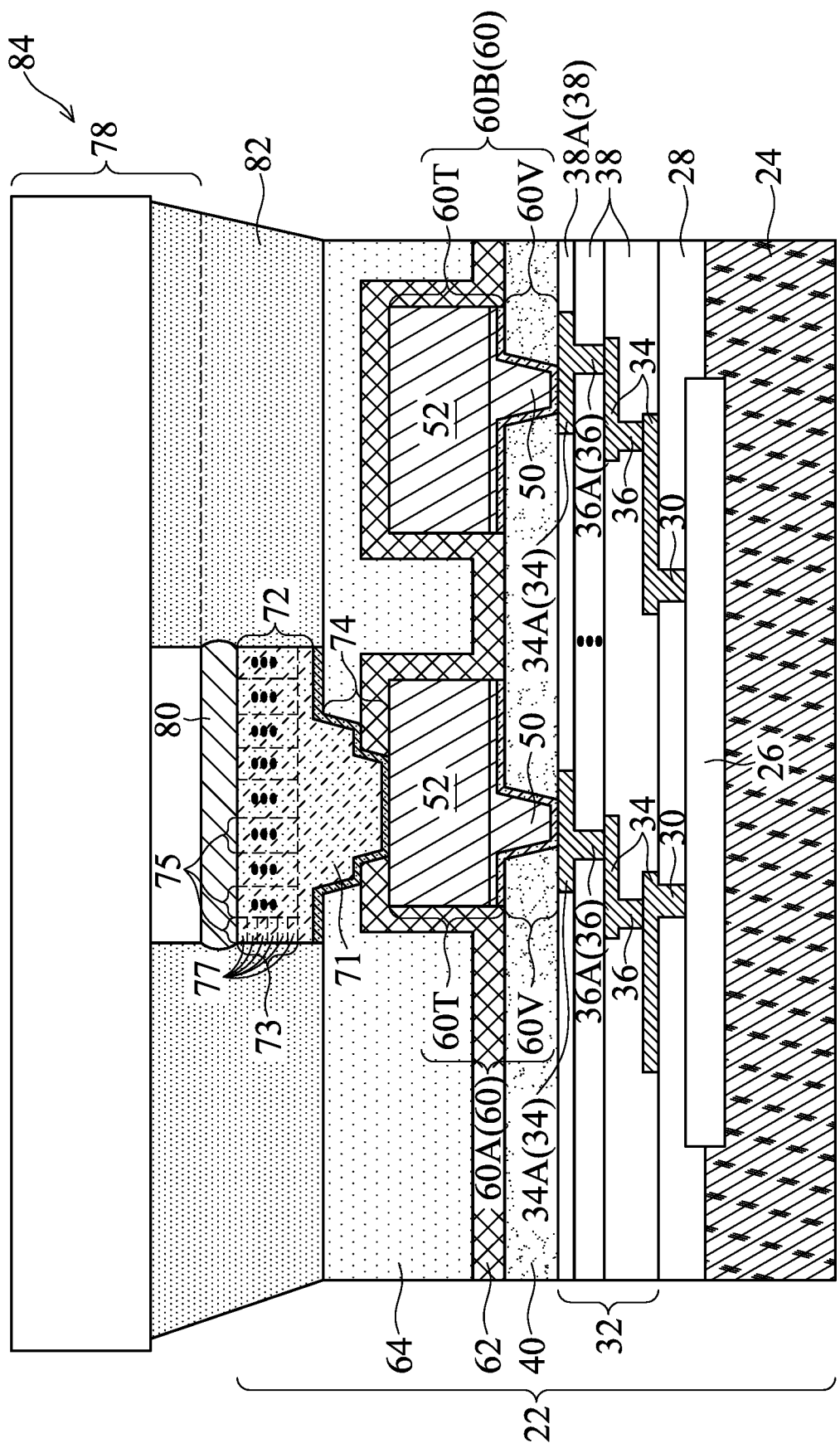

Referring to FIG. 15, device 22 is bonded with package component 78 to form package 84. The respective process is illustrated as process 232 in the process flow 200 as shown in FIG. 22. In accordance with some embodiments, package component 78 is or comprises an interposer, a package substrate, a printed circuit board, a package, or the like. Electrical connector 72 in device 22 may be bonded to package component 78 through solder region 80. Underfill 82 is dispensed between device 22 and package component 78.

Figure 21:
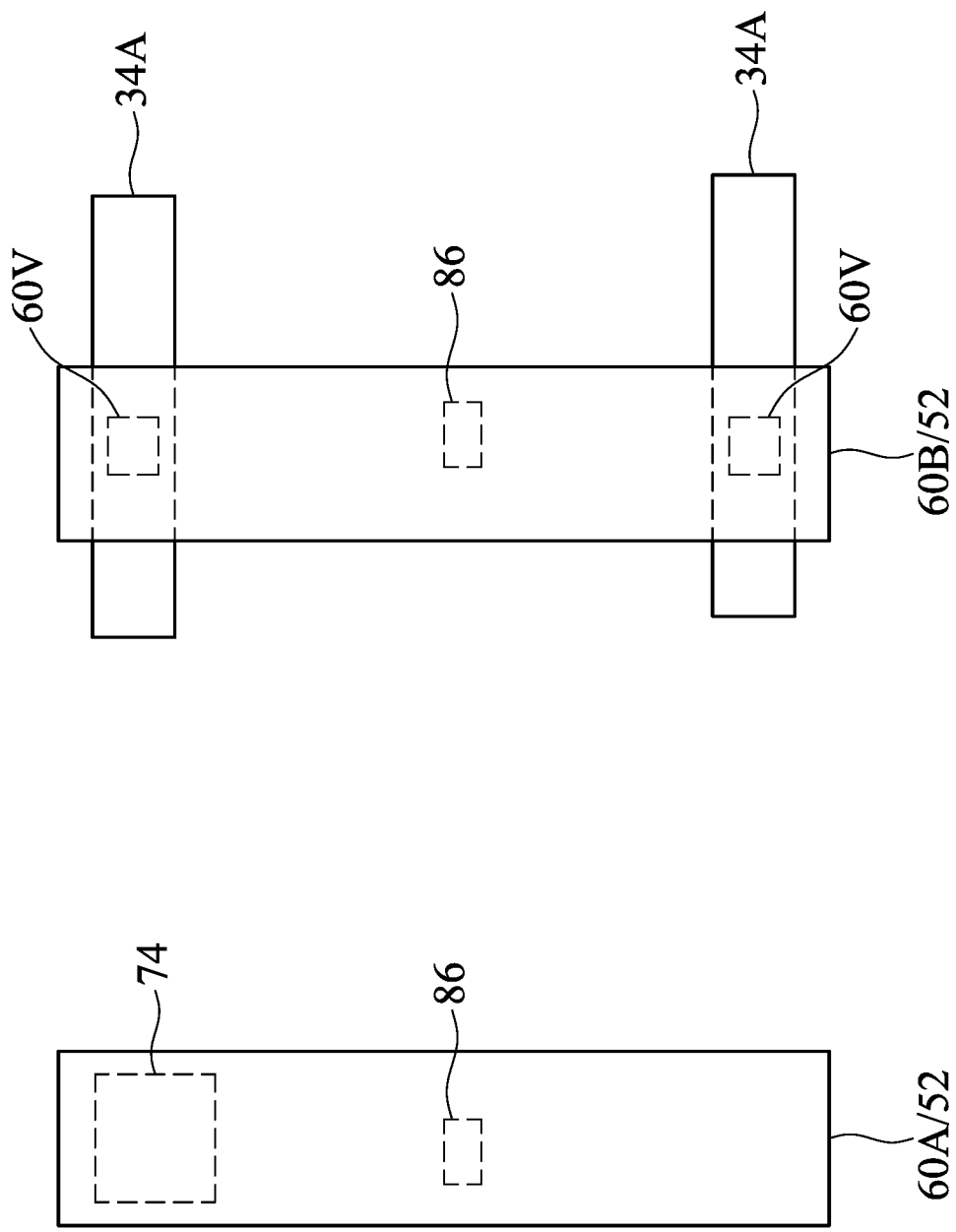
FIG. 21 illustrates the top view of two redistribution lines in accordance with some embodiments.

FIG. 15 illustrates two RDLs 60, which are also denoted as RDLs 60A and 60B. In accordance with some embodiments, RDL 60A is used for electrically connecting electrical connector 72 to the underlying integrated circuit devices 26. On the other hand, RDL 60B is not connected to any overlying electrical connector, and is used for internal electrical redistribution for electrically connecting the features inside device 22. For example, the opposing ends of RDL 60B may be connected to two of metal lines 34A (FIGS. 15 and 21). Alternatively stated, an entirety of RDL 60B is covered by passivation layer 62, and all sidewalls of RDL 60B may be in contact with passivation layer 62.

FIG. 21 illustrates the top view of example RDLs 60A and 60B in accordance with some embodiments. Each of RDLs 60A and 60B includes conductive feature 52. The top view as shown in FIG. 20 may be the view of regions 86 in FIG. 21. Via 74 (Also refer to FIG. 15) is over and lands on a top surface of RDL 60A. The opposing ends of RDL 60B may be connected to two underlying metal lines 34A through vias 60V. Accordingly, RDL 60B is used as an internal redistribution line.

The embodiments of the present disclosure have some advantageous features. By forming nano columns, which includes nano plates having horizontal interfaces, the stress passed in from other package components are more likely to be laterally distributed along the horizontal interfaces, and are less likely to be passed down through the grain boundaries that may extend in random directions. Accordingly, the delamination between the RDLs and its neighboring features such as passivation layers is reduced. Furthermore, the nano plates in the nano column have the function of confining copper atoms within the nano plates from electro-migration.

In accordance with some embodiments of the present disclosure, a method includes forming a seed layer over a first conductive feature of a wafer; forming a patterned plating mask on the seed layer; plating a second conductive feature in an opening in the patterned plating mask, wherein the plating comprises performing a plurality of plating cycles, with each of the plurality of plating cycles comprising: a first plating process performed using a first plating current density; and a second plating process performed using a second plating current density lower than the first plating current density; removing the patterned plating mask; and etching the seed layer. In an embodiment, the first plating process and the second plating process are configured to form a plurality of nano columns, with each of the plurality of nano columns comprising a plurality of stacked nano plates. In an embodiment, the each of the plurality of stacked nano plates comprises a plurality of grains. In an embodiment, the first plating process is performed for a first period of time, and the second plating process is performed for a second period of time longer than the first period of time. In an embodiment, a ratio of the first plating current density to the second plating current density is in a range between about 10 and about 40. In accordance with some embodiments, the method further comprises depositing a passivation layer on the second conductive feature; forming a planarization layer on the passivation layer; etching-through the planarization layer and the passivation layer; and forming a third conductive feature extending into the planarization layer and the passivation layer to electrically connect to the second conductive feature. In an embodiment, the method further comprises, before the plating the second conductive feature, plating a polycrystalline transition layer on the seed layer, wherein the polycrystalline transition layer is free from nano columns. In an embodiment, the polycrystalline transition layer is plated using a third plating current density higher than the second plating current density.

In accordance with some embodiments of the present disclosure, a device includes a first dielectric layer; a redistribution line comprising a portion over the first dielectric layer, wherein the portion of the redistribution line comprises: a plurality of nano columns extending in a direction perpendicular to a major top surface of the first dielectric layer, wherein each of the plurality of nano columns further comprises a plurality of nano plates; and a second dielectric layer extending on a sidewall and a second top surface of the redistribution line. In an embodiment, the plurality of nano columns is separated from each other by vertical boundaries. In an embodiment, the plurality of nano plates is separated from each other by horizontal interfaces. In an embodiment, each of the plurality of nano plates comprises a plurality of crystalline grains. In an embodiment, over 85 volume percent of grains in the portion of the redistribution line have (111) crystal orientations. In an embodiment, the plurality of nano columns comprise copper. In an embodiment, the redistribution line further comprises a non-stacking nano column, and the non-stacking nano column is free from nano plates therein. In an embodiment, the redistribution line further comprises: a seed layer; and a polycrystalline transition layer over the seed layer and underlying the plurality of nano columns, wherein the polycrystalline transition layer is free from nano columns therein. In an embodiment, both of the plurality of nano columns and the polycrystalline transition layer comprise copper.

In accordance with some embodiments of the present disclosure, a device includes a first passivation layer; a redistribution line comprising a seed layer and a conductive feature over the seed layer, wherein the conductive feature comprises: a via portion extending into the first passivation layer, wherein the via portion has a polycrystalline structure; a line portion, wherein the line portion comprises a plurality of nano columns over the via portion and the first passivation layer; and a second passivation layer extending on sidewalls and a top surface of the plurality of nano columns. In an embodiment, bottom surfaces of the plurality of nano columns are higher than all top surfaces of the seed layer and an additional top surface of the first passivation layer. In an embodiment, each of the plurality of nano columns further comprises stacked nano plates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a seed layer over a first conductive feature of a wafer;
   forming a patterned plating mask on the seed layer;
   plating a second conductive feature in an opening in the patterned plating mask, wherein the plating comprises performing a plurality of plating cycles, with each of the plurality of plating cycles comprising:
     a first plating process performed using a first plating current density; and
     a second plating process performed using a second plating current density lower than the first plating current density;
   removing the patterned plating mask; and
   etching the seed layer.

2. The method of claim 1, wherein the first plating process and the second plating process are configured to form a plurality of nano columns, with each of the plurality of nano columns comprising a plurality of stacked nano plates.

3. The method of claim 2, wherein the each of the plurality of stacked nano plates comprises a plurality of grains, and the each of the plurality of stacked nano plates is a grain larger than the corresponding plurality of grains therein, and the each of the plurality of stacked nano plates comprises clear grain boundaries.

4. The method of claim 1, wherein the first plating process is performed for a first period of time, and the second plating process is performed for a second period of time longer than the first period of time, and wherein a ratio of the first plating current density to the second plating current density is in a range between about 10 and about 40.

5. The method of claim 1, wherein the first plating process performed using the first plating current density and the second plating process performed using the second plating current density are alternated.

6. The method of claim 1 further comprising:
   depositing a passivation layer on the second conductive feature;
   forming a planarization layer on the passivation layer;
   etching-through the planarization layer and the passivation layer; and
   forming a third conductive feature extending into the planarization layer and the passivation layer to electrically connect to the second conductive feature.

7. The method of claim 1 further comprising, before the plating the second conductive feature, plating a polycrystalline transition layer on the seed layer, wherein the polycrystalline transition layer is free from nano columns therein.

8. The method of claim 7, wherein the polycrystalline transition layer is plated using a third plating current density higher than the second plating current density.

9. A method comprising:
   forming a first dielectric layer comprising an opening therein;
   plating a redistribution line comprising a portion over the first dielectric layer, wherein the portion of the redistribution line comprises:
     a plurality of nano columns extending in a direction perpendicular to a major top surface of the first dielectric layer, wherein each of the plurality of nano columns further comprises a plurality of nano plates; and forming a second dielectric layer extending on a sidewall and a second top surface of the redistribution line.

10. The method of claim 9, wherein the plurality of nano columns are separated from each other by vertical boundaries, and the plurality of nano plates are separated from each other by horizontal interfaces.

11. The method of claim 9, wherein the plating the redistribution line comprises a first plurality of plating processes using a first plating current density, and a second plurality of plating processes using a second plating current density smaller than the first plating current density.

12. The method of claim 11, wherein the first plurality of plating processes and the second plurality of plating processes are performed alternatingly.

13. The method of claim 11, wherein a ratio of the first plating current density to the second plating current density is greater than about 10.

14. The method of claim 13, wherein the ratio of the first plating current density to the second plating current density is in a range between about 10 and about 40.

15. The method of claim 9 further comprising, before plating the redistribution line, plating a polycrystalline transition layer.

16. The method of claim 15, wherein the plating the polycrystalline transition layer comprises a first plating process using a higher current density, and a second plating process using a lower current density.

17. The method of claim 16, wherein the second plating process is performed after the first plating process, and at a time after the first plating process and before the second plating process, the polycrystalline transition layer has a first surface roughness, and wherein after the second plating process, the polycrystalline transition layer has a second surface roughness smaller than the first surface roughness.

18. A method comprising:
forming a first passivation layer;
forming a redistribution line comprising:
  forming a metal seed layer;
  forming a polycrystalline transition layer on the metal seed layer; and
  forming a conductive feature over the metal seed layer, wherein the conductive feature comprises:
    a via portion extending into the first passivation layer, wherein the via portion has a polycrystalline structure; and
    a line portion, wherein the line portion comprises a plurality of nano columns over the via portion and the first passivation layer; and
forming a second passivation layer extending on sidewalls and a top surface of the plurality of nano columns.

19. The method of claim 18, wherein bottom surfaces of the plurality of nano columns are higher than all top surfaces of the metal seed layer and an additional top surface of the first passivation layer.

20. The method of claim 18, wherein each of the plurality of nano columns further comprises stacked nano plates.

* * * * *